US011894463B2

United States Patent
Song et al.

(10) Patent No.: US 11,894,463 B2
(45) Date of Patent: Feb. 6, 2024

(54) INTEGRATED CIRCUITS AND METHODS OF MANUFACTURING THE SAME

(71) Applicant: SAMSUNG ELECTRONICS CO., LTD., Suwon-si (KR)

(72) Inventors: Seungmin Song, Hwaseong-si (KR); Bongseok Suh, Seoul (KR); Junggil Yang, Hwaseong-si (KR); Soojin Jeong, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/093,877

(22) Filed: Jan. 6, 2023

(65) Prior Publication Data

US 2023/0163214 A1 May 25, 2023

Related U.S. Application Data

(63) Continuation of application No. 17/320,617, filed on May 14, 2021, now Pat. No. 11,563,121, which is a (Continued)

(30) Foreign Application Priority Data

Jun. 17, 2019 (KR) .......................... 10-2019-0071768

(51) Int. Cl.
*H01L 29/78* (2006.01)
*H01L 29/06* (2006.01)
(Continued)

(52) U.S. Cl.
CPC ...... *H01L 29/7853* (2013.01); *H01L 29/0653* (2013.01); *H01L 29/0673* (2013.01); *H01L 29/0847* (2013.01); *H01L 29/42392* (2013.01)

(58) Field of Classification Search
CPC ............ H01L 29/7853; H01L 29/0653; H01L 29/0673; H01L 29/0847; H01L 29/42392;
(Continued)

(56) References Cited

U.S. PATENT DOCUMENTS 7,402,483 B2  7/2008 Yun et al.
9,673,279 B2  6/2017 Lee et al.
(Continued)

OTHER PUBLICATIONS

Jan et al., A 14 nm SoC Platform Technology Featuring 2nd Generation Tri-Gate Transistors, 70 nm Gate Pitch, 52 nm Metal Pitch, and 0.0499 um2 SRAM cells, Optimized for Low Power, High Performance and High Density SoC Products; Symposium on VLSI Technology Digest of Technical Papers; 2015.

*Primary Examiner* — Changhyun Yi
(74) *Attorney, Agent, or Firm* — Muir Patent Law, PLLC

(57) ABSTRACT

An integrated circuit includes a fin active region protruding from a substrate, a plurality of semiconductor patterns on an upper surface of the fin active region, a gate electrode that surrounds the plurality of semiconductor patterns and includes a main gate part on an uppermost one of the plurality of semiconductor patterns and sub gate parts between the plurality of semiconductor patterns, a spacer structure on a sidewall of the main gate part, and a source/drain region at a side of the gate electrode. The source/drain region is connected to the plurality of semiconductor patterns and contacts a bottom surface of the spacer structure. A top portion of the uppermost semiconductor pattern has a first width. A bottom portion of the uppermost semiconductor pattern has a second width smaller than the first width.

20 Claims, 31 Drawing Sheets

Related U.S. Application Data continuation of application No. 16/747,870, filed on Jan. 21, 2020, now Pat. No. 11,024,741.

(51) Int. Cl.
*H01L 29/08* (2006.01)
*H01L 29/423* (2006.01)

(58) Field of Classification Search
CPC ......... H01L 29/7831; H01L 21/823807; H01L 21/823814; H01L 21/823828
See application file for complete search history.

(56) References Cited

U.S. PATENT DOCUMENTS

| | | |
|---|---|---|
| 9,947,804 B1 | 4/2018 | Frougier et al. |
| 9,991,352 B1 | 6/2018 | Frougier et al. |
| 10,008,575 B2 | 6/2018 | Suh et al. |
| 10,177,235 B2 | 1/2019 | Balakrishnan et al. |
| 10,217,816 B2 * | 2/2019 | Bhuwalka ......... H01L 29/66545 |
| 11,024,741 B2 | 6/2021 | Song et al. |
| 2015/0372104 A1 | 12/2015 | Liu et al. |
| 2017/0110554 A1 * | 4/2017 | Tak ................... H01L 29/42392 |
| 2017/0256609 A1 | 9/2017 | Bhuwalka et al. |
| 2018/0301341 A1 | 10/2018 | Coquand et al. |
| 2018/0301531 A1 | 10/2018 | Xie |
| 2021/0134795 A1 * | 5/2021 | Ju ................... H01L 21/823431 |

* cited by examiner

INTEGRATED CIRCUITS AND METHODS OF MANUFACTURING THE SAME

CROSS-REFERENCE TO RELATED APPLICATION

This is a continuation of U.S. patent application Ser. No. 17/320,617 filed May 14, 2021, which is a continuation of U.S. patent application Ser. No. 16/747,870 filed Jan. 21, 2020, now U.S. Pat. No. 11,024,741 issued on Jun. 1, 2021, both of which are hereby incorporated by reference in their entirety.

This application claims priority under 35 U.S.C. § 119 to Korean Patent Application No. 10-2019-0071768 filed on Jun. 17, 2019 in the Korean Intellectual Property Office, the disclosure of which is hereby incorporated by reference in its entirety.

TECHNICAL FIELD

Example embodiments of the present disclosure relate to integrated circuits and methods of manufacturing the same, and more specifically, to integrated circuits including multi-gate structure transistors and methods of manufacturing the same.

DISCUSSION OF RELATED ART

Due to development of electronic techniques integrated circuits are highly integrated and are down-scaled. As the integrated circuits are down-scaled, reliability of the integrated circuits are lowered by occurrence of a short channel effect. To reduce the short channel effect, multi-gate integrated circuits such as nanosheet transistors have been proposed.

SUMMARY

According to example embodiments, an integrated circuit may include a substrate, a fin active region protruding from the substrate and extending in a first direction, a plurality of semiconductor patterns on an upper surface of the fin active region, a gate electrode surrounding the plurality of semiconductor patterns and extending in a second direction perpendicular to the first direction, the gate electrode including a main gate part and a plurality of sub gate parts, the main gate part disposed on an uppermost one of the plurality of semiconductor patterns, each of the plurality of sub gate parts between two corresponding patterns among the plurality of semiconductor patterns, a spacer structure on a sidewall of the main gate part, and a source/drain region disposed at a side of the gate electrode and connected to the plurality of semiconductor patterns, the source/drain region contacting a bottom surface of the spacer structure. A top portion of the uppermost semiconductor pattern may have a first width in the first direction. A bottom portion of the uppermost semiconductor pattern may have a second width smaller than the first width in the first direction. The main gate part may include a bottom portion having a sloped sidewall.

According to example embodiments, an integrated circuit may include a substrate, a fin active region protruding from the substrate and extending in a first direction, a plurality of semiconductor patterns on an upper surface of the fin active region, a gate electrode surrounding the plurality of semiconductor patterns and extending in a second direction perpendicular to the first direction, the gate electrode including a main gate part and a plurality of sub gate parts, the main gate part disposed on an uppermost one of the plurality of semiconductor patterns, each of the plurality of sub gate parts disposed between two corresponding patterns among the plurality of semiconductor patterns, a spacer structure on a sidewall of the main gate part, and a source/drain region disposed at a side of the gate electrode and connected to the plurality of semiconductor patterns, the source/drain region contacting a bottom surface of the spacer structure. A top portion of the uppermost semiconductor pattern may have a first width in the first direction. A bottom portion of the uppermost semiconductor pattern may have a second width smaller than the first width in the first direction. A bottom portion of the main gate part may have a third width in the first direction. An intermediate portion of the main gate part may have a fourth width different from the third width in first direction.

According to example embodiments, an integrated circuit may include a substrate, a fin active region protruding from the substrate, a plurality of semiconductor patterns on an upper surface of the fin active region, each of the plurality of semiconductor patterns including a channel region, a gate electrode surrounding the plurality of semiconductor patterns and including a main gate part and a plurality of sub gate parts, the main gate part disposed on an uppermost one of the plurality of semiconductor patterns, each of the plurality of sub gate parts disposed between two corresponding patterns among the plurality of semiconductor patterns, a spacer structure on a sidewall of the main gate part, and a source/drain region at a side of the gate electrode and connected to the plurality of semiconductor patterns, the source/drain region contacting a bottom surface of the spacer structure. A bottom portion of the uppermost semiconductor pattern may be wider than a top portion of the uppermost semiconductor pattern. At least a portion of the main gate part may be sloped. The sidewall of the main gate part may be at least partially vertically overlapped with the spacer structure.

BRIEF DESCRIPTION OF THE DRAWINGS

FIGS. 8, 9A, 10A, 11, 12, 13, 14A, 15A, 16A, and 17A are cross-sectional views taken along line A1-A1' of FIG. 1. FIGS. 9B, 10B, 16B, 17B are cross-sectional views taken along line B1-B1' of FIG. 1. FIGS. 14B and 15B are horizontal sectional views at a first vertical level LV1 of FIGS. 14A and 15B.

FIGS. 18 and 19A are cross-sectional views taken along line A1-A1' of FIG. 1. FIG. 19B is a horizontal sectional view at a first vertical level LV1 of FIG. 19A.

DETAILED DESCRIPTION

Figure 1:
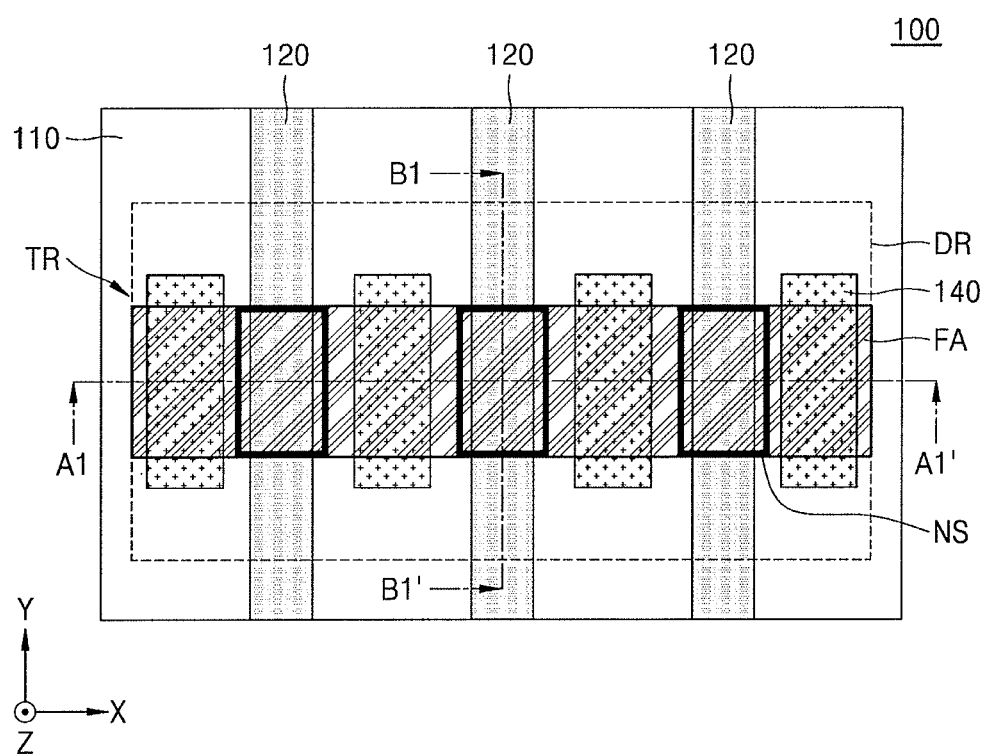
FIG. 1 is a layout view illustrating an integrated circuit according to example embodiments.

Various example embodiments will now be described more fully hereinafter with reference to the accompanying drawings. Like reference numerals may refer to like elements throughout this application.

Figure 2:
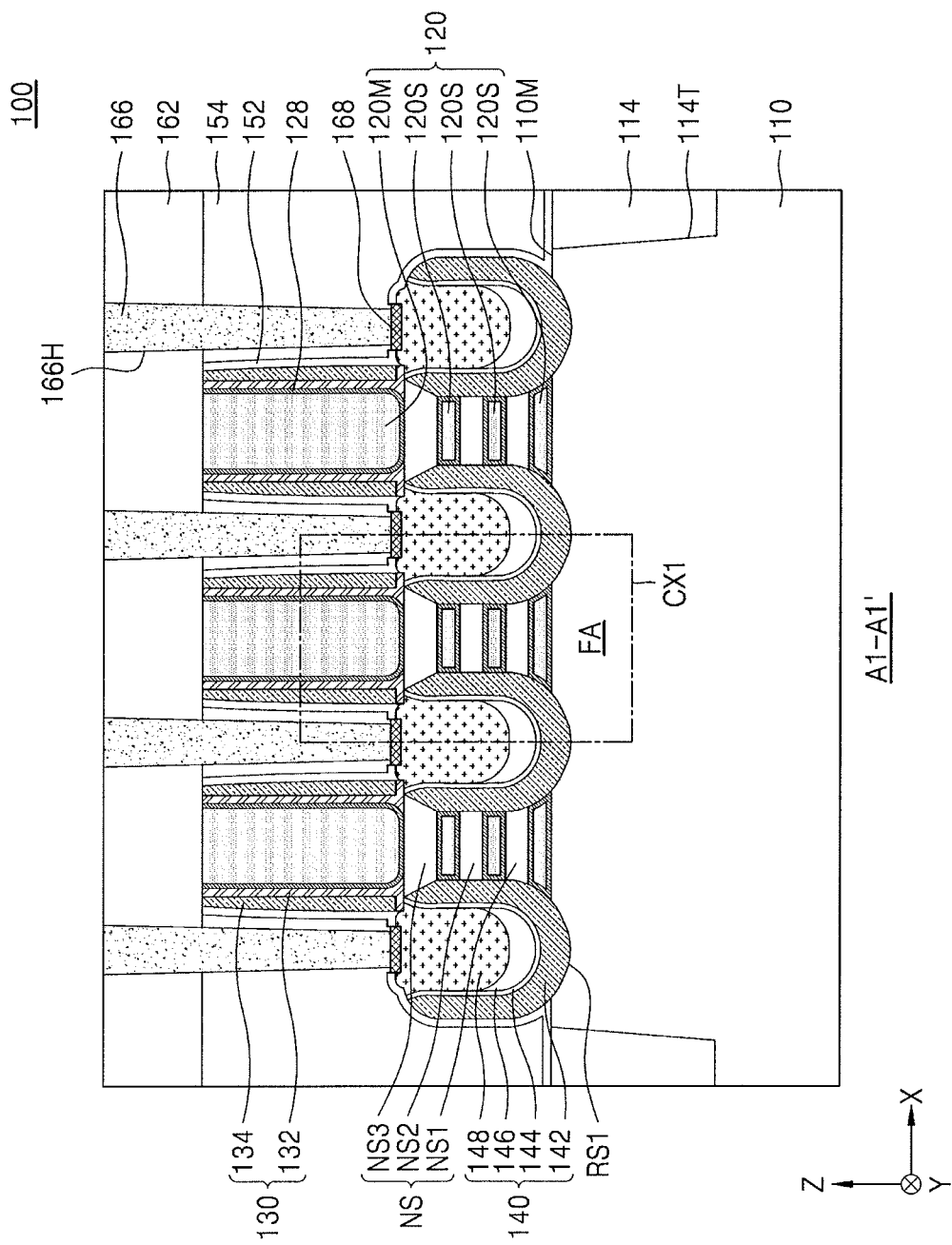
FIG. 2 is a cross-sectional view taken along line A1-A1' of FIG. 1.
Figure 3:
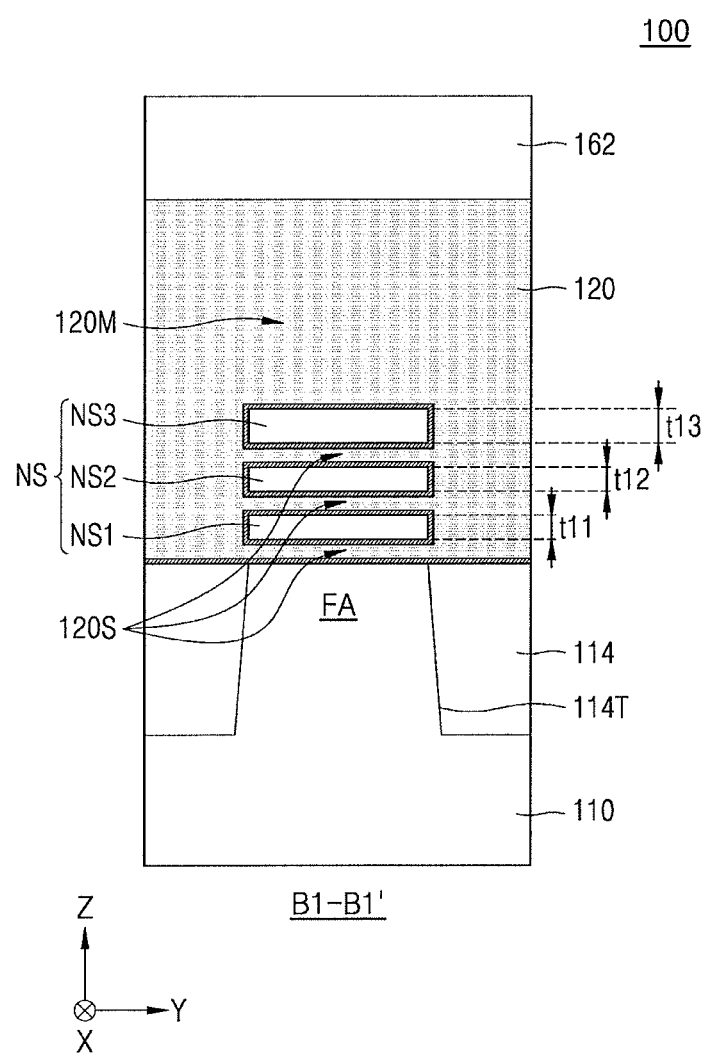
FIG. 3 is a cross-sectional view taken along line B1-B1' of FIG. 1.
Figure 4:
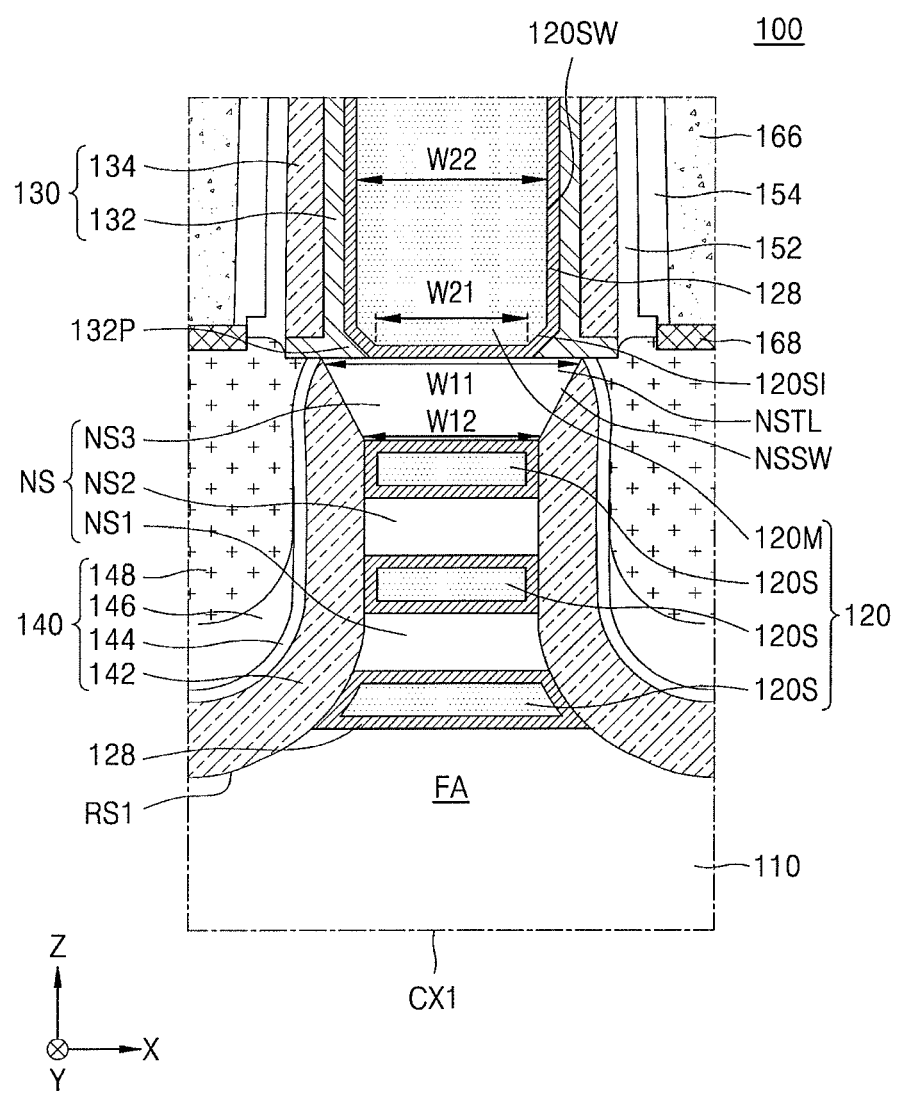
FIG. 4 is an enlarged view of portion CX1 of FIG. 2.

FIG. 1 is a layout view illustrating an integrated circuit according to example embodiments. FIG. 2 is a cross-sectional view taken along line A1-A1' of FIG. 1. FIG. 3 is a cross-sectional view taken along line B1-B1' of FIG. 1. FIG. 4 is an enlarged view of portion CX1 of FIG. 2.

Referring to FIGS. 1 to 4, in an integrated circuit 100 according to example embodiments, a substrate 110 may include a fin active region FA in a device region DR. The fin active region FA may be used to form a transistor TR, for example, an NMOS transistor or a PMOS transistor.

The substrate 110 may include a semiconductor material, such as Si or Ge, or a compound semiconductor material, such as SiGe, SiC, GaAs, InAs, or InP. In some embodiments, the substrate 110 may include a group III-V material and/or a group IV material. The group III-V material may be a binary or ternary, or quaternary compound including at least one group III material and a least one group V material. The group III-V material may include a compound including at least one element of In, Ga, and Al as the Group III material and including at least one element of As, P, and Sb as the group V material. For example, the group III-V material may include at least one of InP, $InZGa_{1-z}As$ (0≤z≤1), and $AlzGa_{1-z}As$ (0≤z≤1). The binary compound may be, for example, one of InP, GaAs, InAs, InSb, and GaSb. The ternary compound may be, for example, one of InGaP, InGaAs, AlInAs, InGaSb, GaAsSb, and GaAsP. The group IV material may be Si or Ge. However, the group III-V material and the group IV material are not limited to those described above.

In some embodiments, the group III-V material and the group IV material such as Ge may be used as a channel material for fabricating a low power and high speed transistor. A high performance CMOS transistor may be formed by using a semiconductor substrate including the group III-V material, for example, GaAs, having higher electron mobility than a silicon substrate, and a semiconductor substrate including a semiconductor material, such as Ge, having a higher hole mobility than the silicon substrate. In some embodiments, when the NMOS transistor is formed on the substrate 110, the substrate 110 may include one of the group materials described above. In some embodiments, when the PMOS transistor is formed on the substrate 110, at least a portion of the substrate 110 may include Ge. In some embodiments, the substrate 110 may have a silicon on insulator (SOI) structure. The substrate 110 may include a conductive region, such as an impurity doped well or and impurity doped structure.

The fin active region FA may extend in a first direction X, and may protrude in a third direction Z from an upper surface 110M of the substrate 110. The first direction may be parallel to the upper surface 110M of the substrate 110. The third direction may be perpendicular to the upper surface 110M of the substrate 110. A device isolation trench 114T may be formed in the substrate 110 to define the fin active region FA. A device isolation layer 114 may be disposed in the device isolation trench 114T. In some embodiments, the device isolation layer 114 may include a device isolation liner conformally formed on an inner surface of the device isolation trench 114T and a gap fill insulation layer disposed on the device isolation liner and filling the device isolation trench 114T. An upper surface of the device isolation layer 114 may be located at the same level as an upper surface of the fin active region FA. In some embodiments, the upper surface of the device isolation layer 114 may be located at a lower level than the upper surface of the fin active region FA, such that lower sidewalls of the fin active region FA may be covered by the device isolation layer 114. The device isolation liner and the gap fill insulation layer may include silicon oxide, silicon nitride, or a combination thereof.

A plurality of semiconductor patterns NS may be disposed on the fin active region FA to be vertically spaced apart from the upper surface 110M of the substrate 110. The plurality of semiconductor patterns NS may include the same material as the substrate 110. For example, the plurality of the semiconductor patterns NS may include a semiconductor material, such as Si or Ge, or a compound semiconductor material, such as SiGe, SiC, GaAs, InAs, or InP. Each of the plurality of semiconductor patterns NS may include a channel region.

The plurality of semiconductor patterns NS may include a first semiconductor pattern NS1, a semiconductor pattern NS2, and a third semiconductor pattern NS3 that are sequentially stacked on the upper surface 110M of the substrate 110. Each of the plurality of semiconductor patterns NS may have a relatively large width in a second direction Y and a relatively small thickness in the third direction Z. Each of the plurality of semiconductor patterns NS may have a nanosheet shape, for example. The second direction Y may be parallel to the upper surface 110M of the substrate 110 and perpendicular to the first direction X. For example, the first semiconductor pattern NS1 may have a first thickness t11 of about 1 nm to 10 nm, the second semiconductor pattern NS2 may have a second thickness t12 of about 1 nm to 10 nm, and the third semiconductor pattern NS3 may have a third thickness t13 of about 1 nm to 20 nm. As shown in FIG. 3, the third thickness t13 of the third semiconductor pattern NS3 may be greater than the first thickness t11 of the first semiconductor pattern NS1 and the second thickness t12 of the second semiconductor pattern NS2, but embodiments are not limited thereto. In some embodiments, each of the plurality of the semiconductor patterns NS may have a width of about 5 nm to 100 nm in the first direction X or the second direction Y, but embodiments are not limited thereto.

As shown in FIG. 2, the plurality of semiconductor patterns NS may be spaced apart from each other. However, embodiments are not limited thereto. For example, spacing distances between the plurality of semiconductor patterns NS may be different from each other. The number of the plurality of semiconductor patterns NS may be limited to that shown in FIGS. 2 to 4.

A gate electrode 120 may extend in the fin active region FA in the second direction Y. The gate electrode 120 may surround the plurality of semiconductor patterns NS and may extend on the fin active region FA and the device isolation layer 114.

The gate electrode 120 may include a main gate part 120M and a plurality of sub gate parts 120S. The main gate part 120M may cover an uppermost semiconductor pattern NS (e.g., an upper surface of the third semiconductor pattern NS3). The plurality of sub gate parts 120S may respectively be disposed between the fin active region FA and a lowermost semiconductor pattern NS and between the plurality of semiconductor patterns NS. For example, the plurality of sub gate parts 120S may be respectively disposed between the fin active region FA and the first semiconductor pattern NS1, between the first semiconductor pattern NS1 and the second semiconductor pattern NS2, and between the second semiconductor pattern NS2 and the third semiconductor pattern NS3. The main gate part 120M may be disposed on the upper surface of the third semiconductor pattern NS3 and the device isolation layer 114, and may be connected to the plurality of sub gate parts 120S.

The main gate part 120M have a sloped sidewall 120SI that is inclined along the third direction Z (or that is not perpendicular to the upper surface 110M of the substrate 110) at a bottom portion of the main gate part 120M. A sidewall 120SW of the main gate part 120M may include the sloped sidewall 120SI that extends to a predetermined height from a bottom surface of the main gate part 120M. For example, a height of the sloped sidewall 120SI of the main gate part 120M in the third direction Z may be about 1% to 20% of a height of the main gate part 120M on the uppermost semiconductor pattern NS.

The gate electrode 120 may include a work function conductive layer and a buried conductive layer. The work function conductive layer may be disposed on the upper surface of the plurality of semiconductor patterns NS, and the buried conductive layer may be disposed on the work function conductive layer. In some embodiments, the work function conductive layer may include Al, Cu, Ti, Ta, W, Mo, TaN, NiSi, CoSi, TiN, WN, TiAl, TiAlC, TiAlN, TaCN, TaC, TaSiN, or a combination thereof, but embodiments are not limited thereto. The buried conductive layer may include Al, Cu, Ti, Ta, W, Mo, TaN, NiSi, CoSi, TiN, WN, TiAl, TiAlC, TiAlN, TaCN, TaC, TaSiN, or a combination thereof. However, embodiments are not limited thereto.

A gate insulation layer 128 may be disposed between the gate electrode 120 and each of the plurality of semiconductor patterns NS. The gate insulation layer 128 may be conformally disposed on surfaces of the plurality of semiconductor patterns NS. The gate insulation layer 128 may be disposed on the upper surface of the fin active region FA, and may extend onto the device isolation layer 114.

In some embodiments, the gate insulation layer 128 may have a stack structure of an interfacial layer and a high dielectric layer. The interfacial layer may function to cure interfacial defects between the high dielectric layer and surfaces of the plurality of the semiconductor patterns NS and between the high dielectric layer and the upper surface of the fin active region FA.

The interfacial layer may include a low dielectric material having a dielectric constant of about 9 or less, for example, silicon oxide, silicon oxynitride, germanium oxide, gallium oxide, or a combination thereof. In some embodiments, the interfacial layer may include silicate, a combination of silicate and silicon oxide, or a combination of silicate and silicon oxynitride. In some embodiments, the interfacial layer may be omitted.

The high dielectric layer may include a material having a higher dielectric constant than that of silicon oxide. For example, the high dielectric layer may have a dielectric constant of about 10 to 25. The high dielectric layer may include, for example, hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof, but embodiments are not limited thereto. The high dielectric layer may be formed by atomic layer deposition (ALD), chemical vapor deposition (CVD), or physical vapor deposition (PVD). The high dielectric layer may have a thickness of about 10~40 Å, but embodiments are not limited thereto.

A spacer structure 130 may be disposed on each of opposite sidewalls of the gate electrode 120. The gate insulation layer 128 may be interposed between the gate electrode 120 and the spacer structure 130. The spacer structure 130 may include a first spacer 132 and a second spacer 134 that are sequentially disposed on the sidewall 120SW of the main gate part 120M.

As shown in FIG. 4, the first spacer 132 may be conformally disposed on the sidewall 120SW of the main gate part 120M and on the third semiconductor pattern NS3 adjacent to the main gate part 120M. A bottom portion of the first spacer 132 may extend in a horizontal direction (e.g., the first direction X) on the upper surface of the third semiconductor pattern NS3, and may be disposed between the second spacer 134 and the third semiconductor pattern NS3. The first and second spacers 132 and 134 may include silicon nitride or silicon oxynitride, but are not limited thereto.

A recess region RS1 may be formed in the fin active region FA at each of opposite sides of the plurality of semiconductor patterns NS. A source/drain region 140 may fill the recess region RS1. The source/drain region 140 may be connected to one ends of the plurality of semiconductor patterns NS.

The source/drain region 140 may include a first semiconductor layer 142, a second semiconductor layer 144, a third semiconductor layer 146, and a fourth semiconductor layer 148 that are sequentially stacked on an inner surface of the recess region RS1. The first to fourth semiconductor layers 142, 144, 146, and 148 may be grown from the fin active region FA and the plurality of semiconductor patterns NS by a selective epitaxial growth (SEG) process.

In some embodiments, the first semiconductor layer 142 may be formed to a predetermined thickness in the inner surface of the recess region RS1, and may contact the plurality of semiconductor patterns NS. The second semiconductor layer 144 may be conformally formed to a relatively small thickness on the first semiconductor layer 142. The third semiconductor layer 146 may be formed to fill a lower portion of the recess region RS1. The fourth semiconductor layer 148 may be formed on the third semiconductor layer 146 and the second semiconductor layer 144 to fill an upper portion of the recess region RS1. A portion of an upper surface of the fourth semiconductor layer 148 may contact a bottom surface of the spacer structure 130. Another portion of the upper surface of the fourth semiconductor layer 148 may protrude to a higher level than the bottom surface of the spacer structure 130. Thus, the fourth semiconductor layer 148 may fill the upper portion of the recess region RS1, and an edge portion of the fourth semiconductor layer 148 may extend below the spacer structure 130 to be overlapped with the spacer structure 130.

The first to fourth semiconductor layers 142, 144, 146, and 148 may include at least one of an epitaxial Si layer, an epitaxial SiGe layer, an epitaxial SiP layer. In some embodiments, all the first to fourth semiconductor layers 142, 144, 146, and 148 may include a Si layer, and impurity concentrations of the first to fourth semiconductor layers 142, 144, 146, and 148 may be different from each other. In some embodiments, all the first to fourth semiconductor layers 142, 144, 146, and 148 may include a SiGe layer, and Ge contents of the first to fourth semiconductor layers 142, 144, 146, and 148 may be different from each other. In some embodiments, at least one of the first to fourth semiconductor layers 142, 144, 146, and 148 may include a Si layer, and at least another one of the first to fourth semiconductor layers 142, 144, 146, and 148 may include a SiGe layer. However, embodiments are not limited thereto. In some embodiments, at least one of the first to fourth semiconductor layers 142, 144, 146, and 148 may be omitted. In some embodiments, at least one additional semiconductor layer may be formed between adjacent two layers of the first to fourth semiconductor layers 142, 144, 146, and 148.

As shown in FIG. 4, the recess region RS1 may have a greater width at an intermediate portion than at an upper portion. Thus, a width of the source/drain region 140 in the recess region RS1 may be greater at an uppermost portion than at an intermediate portion, such that at least a portion of the plurality of semiconductor patterns NS contacting the source/drain region 140 may have a sloped sidewall.

The source/drain region 140 may have a sloped sidewall, and thus the uppermost semiconductor pattern NS (or the third semiconductor pattern NS3) may have a pair of sloped sidewalls NSSW conforming to a profile of the sloped sidewall of the source/drain region 140. For example, each of the pair of sloped sidewalls NSSW may contact the first semiconductor layer 142 of the source/drain region 140. A top portion of the uppermost semiconductor pattern NS (or the third semiconductor pattern NS3) may have a first width W11 in the first direction X, and a bottom portion of the uppermost semiconductor pattern NS (or the third semiconductor pattern NS3) may have a second width W12 smaller than the first width in the first direction X.

The uppermost semiconductor pattern (or the third semiconductor pattern NS3) may include a tail portion NSTL adjacent to (or below) the spacer structure 130 at each of opposite edge portions thereof in the first direction X. The tail portion NSTL may indicate a portion of the uppermost semiconductor pattern NS (or the third semiconductor pattern NS3) vertically overlapped with the spacer structure 130. The tail portion NSTL may project outward in the first direction X with respect to the sidewall 120SW of the main gate part 120M. For example, an edge of the tail portion NSTL may be disposed spaced apart from the sidewall 120SW in the first direction X. As a portion of the plurality of the semiconductor patterns NS include the tail portion NSTL, a portion of the plurality of semiconductor patterns NS may have a reverse trapezoidal shape. The tail portion NSTL may be disposed inward with respect to an outer sidewall of the spacer structure 130 (e.g., one sidewall of the spacer structure 130 opposite to another sidewall of the spacer structure 130 contacting the main gate part 120M), and may be disposed spaced apart from the outer sidewall of the spacer structure 130 in the first direction X.

The bottom portion of the main gate part 120M may have a third width W21 in the first direction X, and an intermediate portion of the main gate part 120M may have a fourth width W22 greater than the third width W21 in the first direction X. The first spacer 132 may fill a space defined by the sloped sidewall 120S1 of the bottom portion of the main gate part 120M and the upper surface of the uppermost semiconductor pattern NS (or the third semiconductor pattern NS3). For example, the first spacer 132 may include a protrusion 132P at the bottom portion of the first spacer 132, and the protrusion 132P may fill the space defined by the sloped sidewall 120SI of the bottom portion of the main gate part 120M and the upper surface of the uppermost semiconductor pattern NS (or the third semiconductor pattern NS3). The gate insulation layer 128 may be interposed between the sloped sidewall 120S1 of the main gate part 120M and the protrusion 132P of the first spacer 132. The sloped sidewall 120SI of the main gate part 120M may vertically overlapped with a portion of the spacer structure 130, e.g., the protrusion 132P of the first spacer 132.

As described above, the uppermost semiconductor pattern NS (e.g., the third semiconductor pattern NS3) may have a reverse trapezoidal shape. The first width W11 of the top portion of the uppermost semiconductor pattern NS (or the third semiconductor pattern NS3) may be greater than the third width W21 of the bottom portion of the main gate part 120M. Since the protrusion 132P of the first spacer 132 is disposed between the bottom portion of the main gate part 120M and the source/drain region 140, the spacing distance between the source/drain region 140 and the main gate part 120M may be relatively increased compared to a structure in which the main gate part 120M has a vertical sidewall at a bottom portion thereof. Accordingly, a leakage current between the source/drain region 140 and the main gate part 120M may be prevented or reduced. In addition, in a process of forming the source/drain region 140 or a process of removing a dummy gate structure (see DG of FIG. 15A) and forming the gate electrode 120, a process defect, such as an undesired connection between the dummy gate structure DG and the source/drain region 140 or between the gate electrode 120 and the source/drain region 140, may be prevented.

A gate insulation liner 152 and an inter-gate insulation layer 154 may be sequentially disposed on a sidewall of the spacer structure 130, the source/drain region 140, and the device isolation layer 114. An upper insulation layer 162 may be disposed on the gate electrode 120 and the inter-gate insulation layer 154. A contact plug 166 may be disposed in a contact hole 166H that penetrates the upper insulation layer 162 and exposes an upper surface of the source/drain region 140. A metal silicide layer 168 may be disposed between the contact plug 166 and the source/drain region 140. For example, the metal silicide layer 168 may include titanium silicide or cobalt silicide, but is not limited thereto.

Although not shown in the drawings, vias and interconnection layers may be disposed on the upper insulation layer 162 to be connected the contact plug 166 and the gate electrode 120.

In general, the dummy gate structure (see DG of FIG. 15A) may be formed on the plurality of semiconductor patterns NS, the recess region RS1 may be formed by removing portions of the semiconductor patterns NS at each of opposite sides of the dummy gate structure DG, and the source/drain region 140 may be formed in the recess region RS1. However, since a spacing distance between the recess region RS1 and the dummy gate structure DG may be relatively small at an edge portion of the semiconductor patterns NS, a process defect, such as an undesired connection between the dummy gate structure DG and the source/drain region 140 or between the gate electrode 120 and the source/drain region 140, may be generated. Accordingly, a leakage current may be generated between the gate electrode 120 and the source/drain region 140

According to example embodiments, a portion of the plurality of semiconductor patterns NS may have the reverse trapezoidal shape, and the uppermost semiconductor pattern NS may have a tail portion NSTL at each of opposite edges thereof. Thus, a relatively great spacing distance between the source/drain region 140 and the dummy gate structure DG or the source/drain region 140 and the gate electrode 120 may be obtained, such that the process defect, such as an undesired connection between the dummy gate structure DG and the source/drain region 140 or between the gate electrode 120 and the source/drain region 140, may be prevented. Accordingly, a leakage current between the source/drain region 140 and the main gate part 120M may be prevented or reduced.

Figure 5:
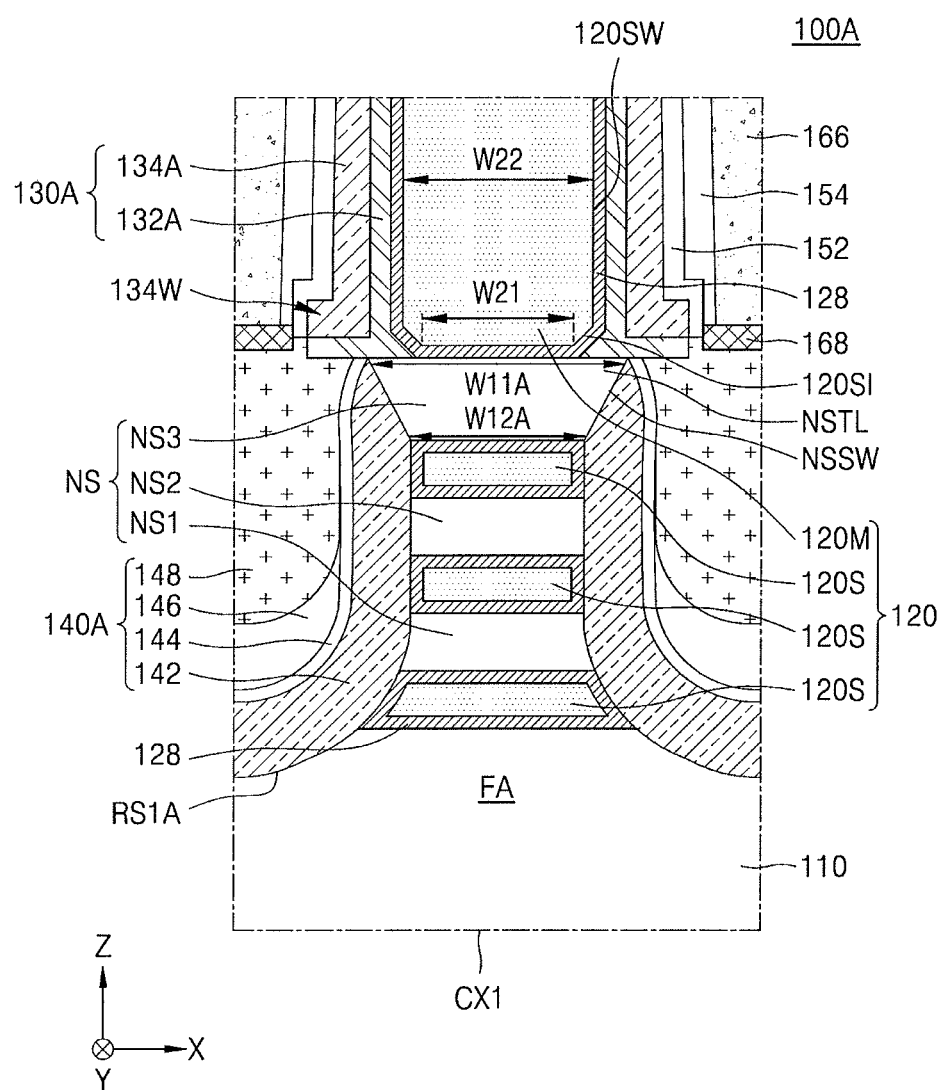
FIG. 5 is a cross-sectional view illustrating an integrated circuit according to example embodiments.

FIG. 5 is a cross-sectional view illustrating an integrated circuit according to example embodiments. In FIG. 5, the same numerals are used to denote the same elements shown in FIGS. 1 to 4.

Referring to FIG. 5, in an integrated circuit 100A according to example embodiments, a spacer structure 130A may include a first spacer 132A and a second spacer 134A that are sequentially disposed on a sidewall of the gate electrode 120. A bottom portion of the first spacer 132A and a bottom portion of the second spacer 134A may extend in the horizontal direction on an upper surface of the plurality of semiconductor patterns NS. The second spacer 134A may include a lateral extension 134W that extends outward from a sidewall of the first spacer 132A. The bottom portion of the first spacer 132A may be interposed between the lateral extension 134W and the uppermost semiconductor pattern NS (the third semiconductor pattern NS3). The lateral extension 134W may be vertically overlapped with the tail portion NSTL of the uppermost semiconductor pattern NS (or the third semiconductor pattern NS3).

As the lateral extension 134W is disposed over the upper surface of the uppermost semiconductor pattern NS, in a process of etching the semiconductor patterns NS to form a recess region RS1A, the upper surface of the uppermost semiconductor pattern NS may be covered by the spacer structure 130A, and thus the uppermost semiconductor pattern NS may have a sloped sidewall NSSW tilted at a relatively large angle. A spacing distance between a source/drain region 140A and the main gate part 120M may be relatively large.

A first width W11A of the top portion of the uppermost semiconductor pattern NS in the first direction X may be greater than a second width W12A of the bottom portion of the uppermost semiconductor patterns NS in the first direction X. For example, the first width W11A of the top portion of the uppermost semiconductor pattern NS in the first direction X may be greater than the first width W11 of the top portion of the uppermost semiconductor pattern NS described with reference to FIGS. 1 to 4, but embodiments are not limited thereto.

In a manufacturing process according to example embodiments, a first spacer layer (see 132L of FIG. 18), a second spacer layer (see 134L of FIG. 18), and a cover spacer layer (see 136LA of FIG. 18) may be formed on the dummy gate structure (see DG of FIG. 18), and an anisotropic etching process may be performed on the first spacer layer 132L, the second spacer layer 134L, and the cover spacer layer 136LA to form the spacer structure 130A. When the cover spacer layer 136LA has a relatively great thickness, a portion of the second spacer layer 134L extending in the horizontal direction from the dummy gate structure (see DG of FIG. 18) on the plurality of the semiconductor patterns NS may be relatively less etched due to the cover spacer layer 136LA in the anisotropic etching process, such that the lateral extension 134W may remain.

According to the integrated circuit 100A, since a spacing distance between the source/drain region 140A and the main gate part 120M is relatively great, a leakage current between the source/drain region 140A and the main gate part 120M may be prevented or reduced. A process defect, such as an undesired connection between the dummy gate structure DG and the source/drain region 140 or between the gate electrode 120 and the source/drain region 140, may be prevented.

Figure 6:
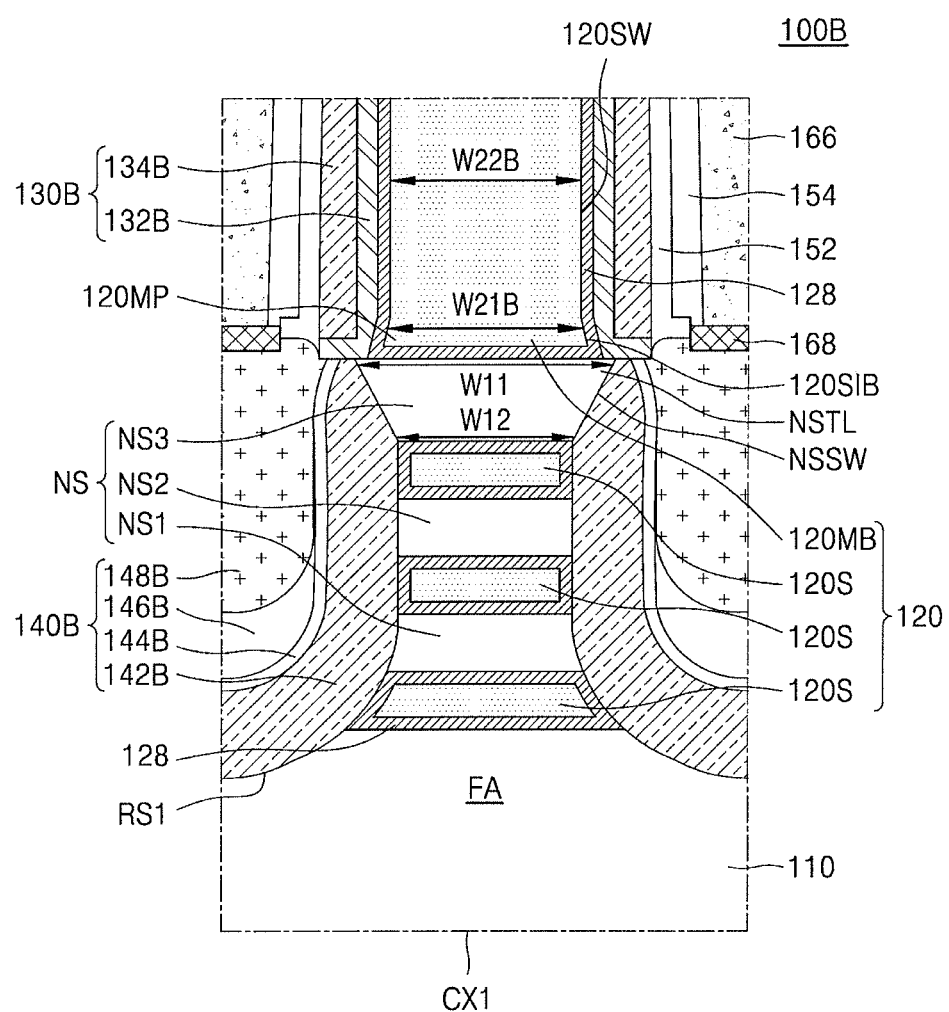
FIG. 6 is a cross-sectional view illustrating an integrated circuit according to example embodiments.

FIG. 6 is a cross-sectional view illustrating an integrated circuit according to example embodiments. In FIG. 6, the same numerals are used to denote the same elements shown in FIGS. 1 to 5.

Referring to FIG. 6, in an integrated circuit 100B according to example embodiments, a bottom portion of a main gate part 120MB may have a third width W21B, and an intermediate portion of the main gate part 120MB may have a fourth width W22B smaller than the third width W21B. The bottom portion of the main gate part 120MB may have a sloped sidewall 120SIB. The sloped sidewall 120SIB may have a positive slope (or may downwardly and outwardly extend). A portion of the main gate part 120MB adjacent to the sloped sidewall 120SIB of the main gate part 120MB may refer to a protrusion 120MP. The protrusion 120MP of the main gate part 120MB may protrude outward toward a spacer structure 130B at the bottom portion of the main gate part 120MB.

A spacer structure 130B may include a first spacer 132B and a second spacer 134B. A portion of the first spacer 132B adjacent to the protrusion 120MP of the main gate part 120MB may have a relatively thin thickness.

Figure 10A:
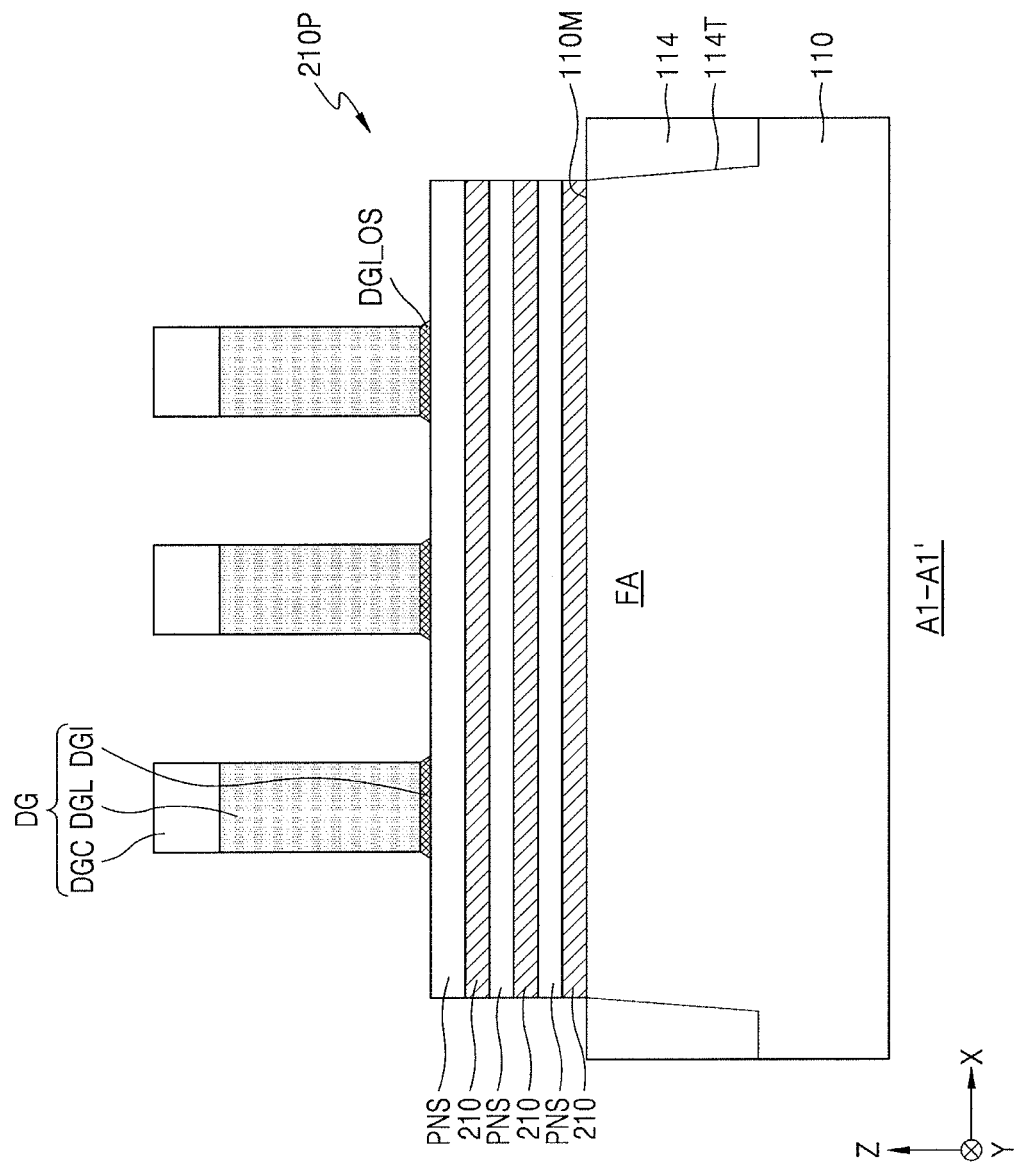
Figure 10B:
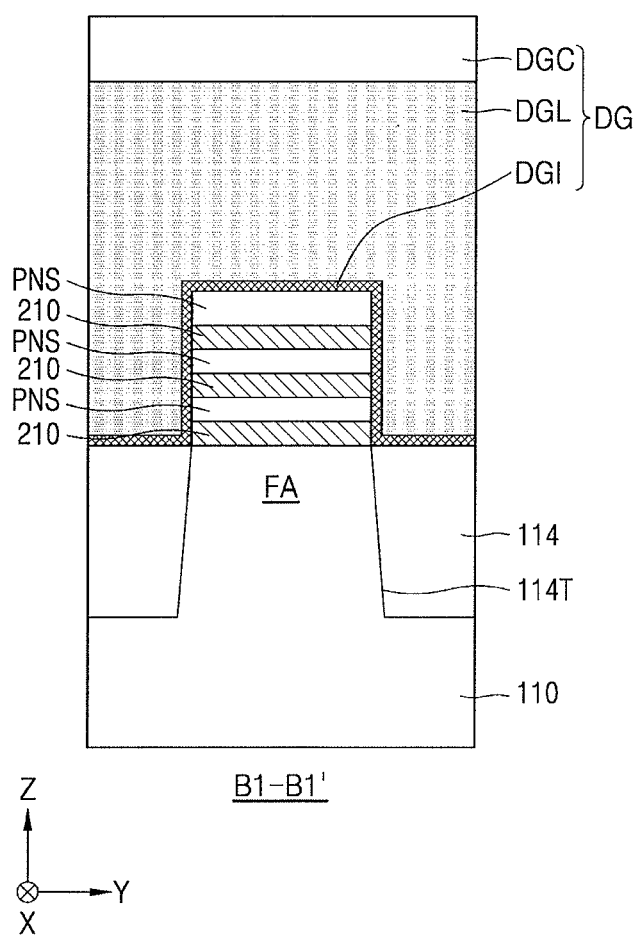
Figure 11:
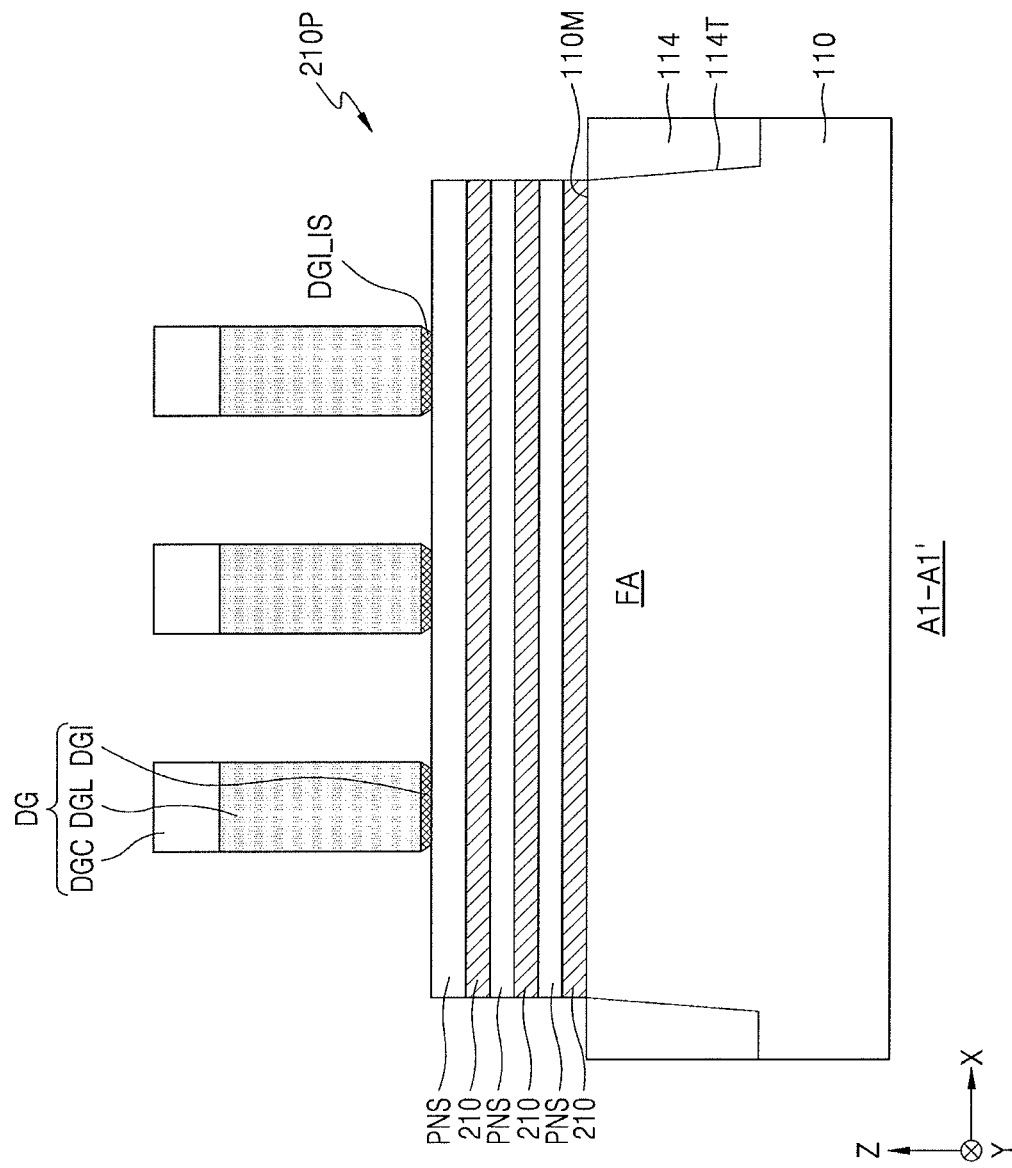

In a manufacturing process according to example embodiments, an etching process may be performed on a sidewall (see DGI_OS of FIG. 10A) of a dummy gate insulation layer (see DGI of FIG. 10A) under the dummy gate structure (see DG of FIG. 10), such that the dummy gate insulation layer (see DGI of FIG. 11) is formed to have a recessed sidewall (see DGI_IS of FIG. 11). Thereafter, the spacer structure (see 130 of FIG. 13) may be formed on the dummy gate structure (see DG of FIG. 13). In addition, the recess region RS1 may be formed at each of opposite sides of the dummy gate structure DG, and a source/drain region 140B may be formed in the recess region RS1. After a process of removing the dummy gate structure DG is performed, a portion of a bottom portion of the first spacer 132B on an upper surface of the exposed semiconductor pattern NS may be removed. In this case, since a spacing distance between the dummy gate structure DG and the source/drain region 140 is relatively great, the source/drain region 140 may be prevented from being exposed to an etching environment, in the removal process of the dummy gate structure DG.

The source/drain region 140B may include a first semiconductor layer 142B, a second semiconductor layer 144B, a third semiconductor layer 146B, and a fourth semiconductor layer 148B that are sequentially disposed in the recess region RS1. The first semiconductor layer 142B may have a relatively great thickness. An upper surface of the first semiconductor layer 142B may contact a bottom surface of the spacer structure 130B.

In some embodiments, all the first, second, third, fourth semiconductor layers 142B, 144B, 146B, and 148B may include a Si layer, impurity concentrations of the first to fourth semiconductor layers 142B, 144B, 146B, and 148B may differ from each other. In some embodiments, all the first to fourth semiconductor layers 142B, 144B, 146B, and 148B may include a SiGe layer, and Ge contents of the first to fourth semiconductor layers 142B, 144B, 146B, and 148B may be different from each other. For example, the first semiconductor layer 142B may have a relatively low impurity concentration or a relatively low Ge content, and the third semiconductor layer 146B and the fourth semiconductor layer 148B may have a relatively high impurity concentration or a relatively high Ge content. In this case, a spacing distance between the third semiconductor layer 146B and the main gate part 120MB or between the fourth semiconductor layer 148B and the main gate part 120MB may be relatively great, and a leakage current between the source/drain region 140B (e.g., the third semiconductor layer 146B and the fourth semiconductor layer 148B of the source/drain region 140B) and the main gate part 120M may be prevented or reduced.

Figure 7:
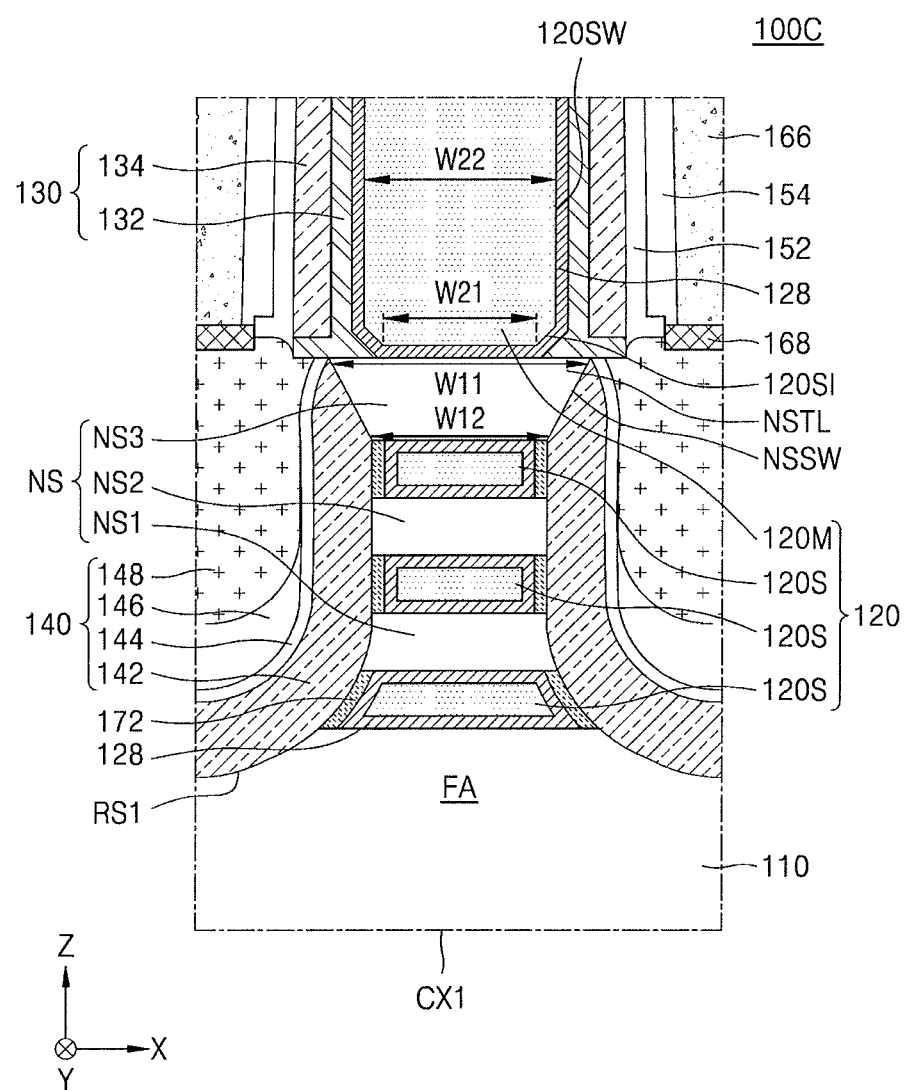
FIG. 7 is a cross-sectional view illustrating an integrated circuit according to example embodiments.

FIG. 7 is a cross-sectional view illustrating an integrated circuit according to example embodiments. In FIG. 7, the same numerals are used to denote the same elements shown in FIGS. 1 to 4.

Referring to FIG. 7, in an integrated circuit 100C according to example embodiments, an inner spacer 172 may be disposed between the source/drain region 140 and the gate electrode 120. The inner spacer 172 may be disposed between each of a plurality of sub gate parts 120S and the source/drain region 140, and the gate insulation layer 128 may be disposed between each of the plurality of sub gate parts 120S and the inner spacer 172. For example, the inner spacer 172 may include silicon nitride or silicon oxynitride.

In the integrated circuit 100C according to example embodiments, since a spacing distance between the source/drain region 140 and the main gate part 120M is relatively great, a leakage current between the source/drain region 140 and the main gate part 120M may be prevented or reduced.

FIGS. 8, 9A, 9B, 10A, 10B, 11, 12, 13, 14A, 14B, 15A, 15B, 16A, 16B, 17A, and 17B are cross-sectional views illustrating a method of manufacturing an integrated circuit according to example embodiments. FIGS. 8, 9A, 10A, 11, 12, 13, 14A, 15A, 16A, and 17A are cross-sectional views taken along line A1-A1' of FIG. 1. FIGS. 9B, 10B, 16B, 17B are cross-sectional views taken along line B1-B1' of FIG. 1. FIGS. 14B and 15B are horizontal sectional views at a first vertical level LV1 of FIGS. 14A and 15B.

Figure 8:
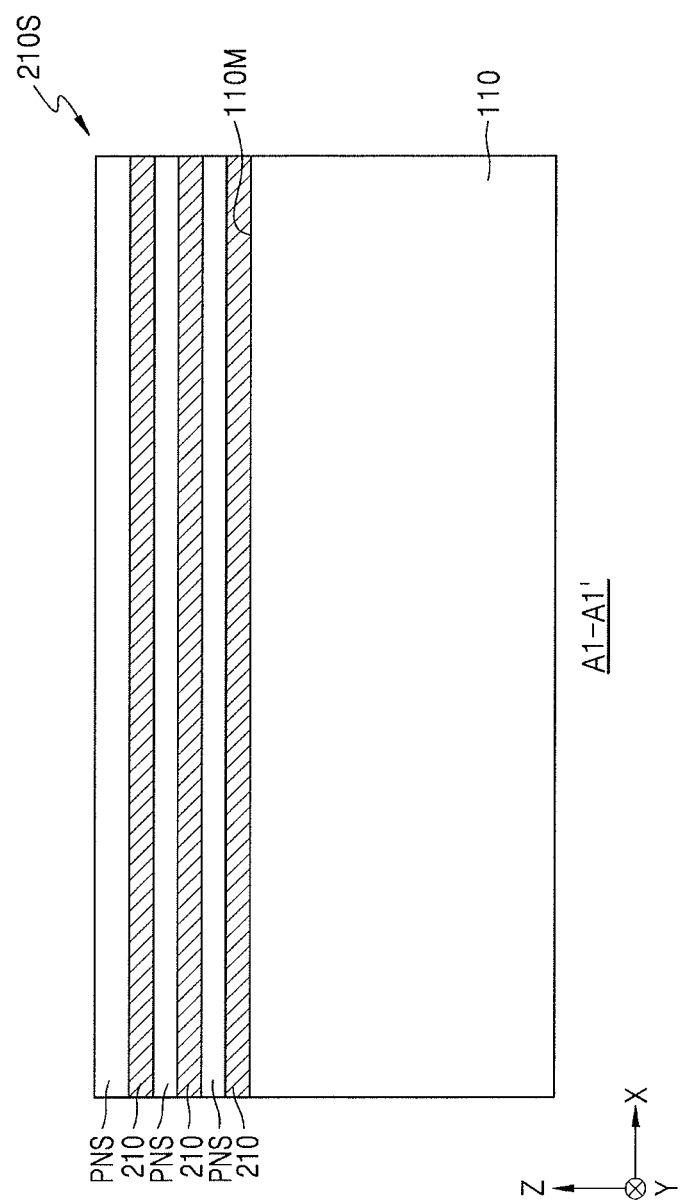
FIGS. 8, 9A, 9B, 10A, 10B, 11, 12, 13, 14A, 14B, 15A, 15B, 16A, 16B, 17A, and 17B are cross-sectional views illustrating a method of manufacturing an integrated circuit according to example embodiments.

Referring to FIG. 8, sacrificial layers 210 and channel semiconductor layers PNS may be repeatedly and alternately formed on the upper surface 110M of the substrate 110 to form a sacrificial stack 210S. The sacrificial layers 210 and the channel semiconductor layers PNS may be formed by an epitaxial process.

In some embodiments, the sacrificial layers 210 and the channel semiconductor layers PNS may be formed of materials having different etch selectivities. For example, the sacrificial layers 210 and the channel semiconductor layers PNS may be formed of a group IV semiconductor single crystal layer, a group IV-IV compound semiconductor single crystal layer, or a group III-V compound semiconductor single crystal layer. For example, the sacrificial layers 210 may be formed of a different material form the channel semiconductor layers PNS. In some embodiments, the sacrificial layers 210 may be formed of silicon germanium (SiGe), and the channel semiconductor layers PNS may be formed of crystal silicon.

In some embodiments, the epitaxial process may include a chemical vapor deposition (CVD) process, such as vapor-phase epitaxy (VPE), or ultra-high vacuum CVD (UHV-CVD), a molecular beam epitaxy, or a combination thereof. In the above epitaxial process, a liquid or vapor precursor may be used to form the sacrificial layers 210 and the channel semiconductor layers PNS.

Figure 9A:
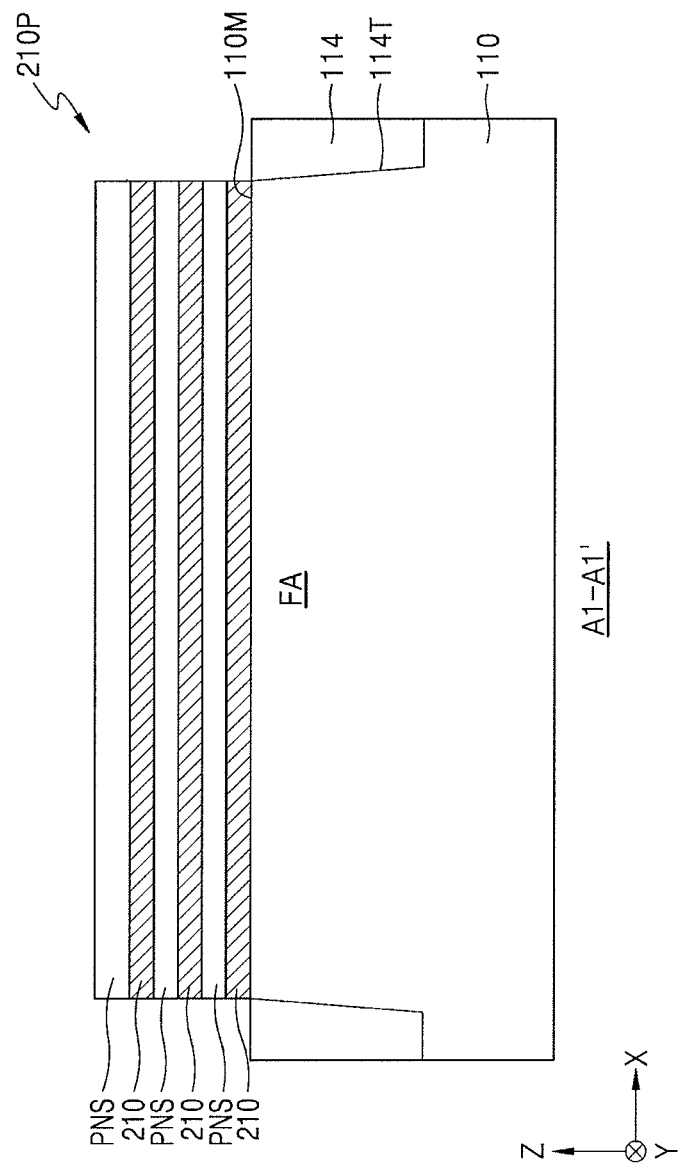
Figure 9B:
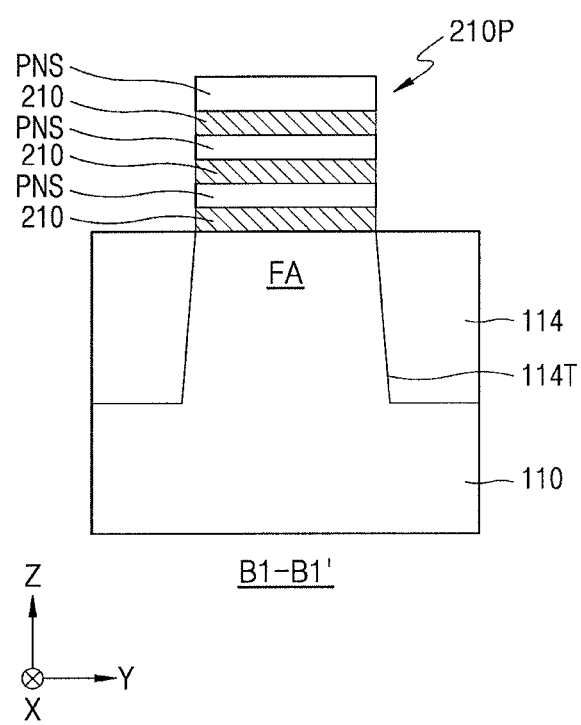

Referring to FIGS. 9A and 9B, after a hard mask pattern extending in the first direction X to a predetermined length is formed on an uppermost one of the channel semiconductor layers PNS, the sacrificial layers 210, the channel semiconductor layers PNS, and the substrate 110 may be etched using the hard mask pattern as an etch mask to form a sacrificial pattern 210P and a device isolation trench 114T.

After the device isolation trench 114T is filled with an insulating material, the insulating material may be planarized to form the device isolation layer 114 filling the device isolation trench 114T. The fin active region FA may be defined in the substrate 110 by the device isolation layer 114.

The hard mask pattern remaining on the sacrificial pattern 210P may be removed, and then the device isolation layer 114 may be removed by a predetermined thickness by a recess process. In some embodiments, the recess process may be performed until an upper surface of the device isolation layer 114 is located at the same level as the upper surface 110M of the substrate 110. In some embodiments, the recess process may be performed until an upper surface of the device isolation layer 114 is located at a lower level than the upper surface 110M of the substrate 110, such that a portion of a sidewall of the fin active region FA may be exposed.

FIGS. 10A and 10B, the dummy gate structure DG may be formed on the sacrificial pattern 210P and the device isolation layer 114. The dummy gate structure DG may include a dummy gate insulation layer DGI, a dummy gate line DGL, and a dummy gate capping layer DGC.

For example, the dummy gate line DGL may be formed of polysilicon. The dummy gate capping layer DGC may be formed of silicon nitride. The dummy gate insulation layer DGI may be formed of a material having an etch selectivity with respect to the dummy gate line DGL and may be formed of, for example, one of thermal oxide, silicon oxide, and silicon nitride.

The dummy gate insulation layer DGI may have a sidewall DGI_OS protruding outward from a sidewall of the dummy gate structure DG. For example, when a height of the dummy gate structure DG is relatively high, a portion of the dummy gate insulation layer DGI may remain without being removed under an etching environment, such that the sidewall DGI_OS of the dummy gate insulation layer DGI may protrude outward from the sidewall of the dummy gate line DGL.

Referring to FIG. 11, an additional etching process for removing a portion of the sidewall DGI_OS of the dummy gate insulation layer DGI may be performed, such that the dummy gate insulation layer DGI may have a recessed sidewall DGI_IS. The recessed sidewall DGI_IS of the dummy gate insulation layer DGI may be a portion recessed inward from the sidewall of the dummy gate line DGL.

Figure 12:
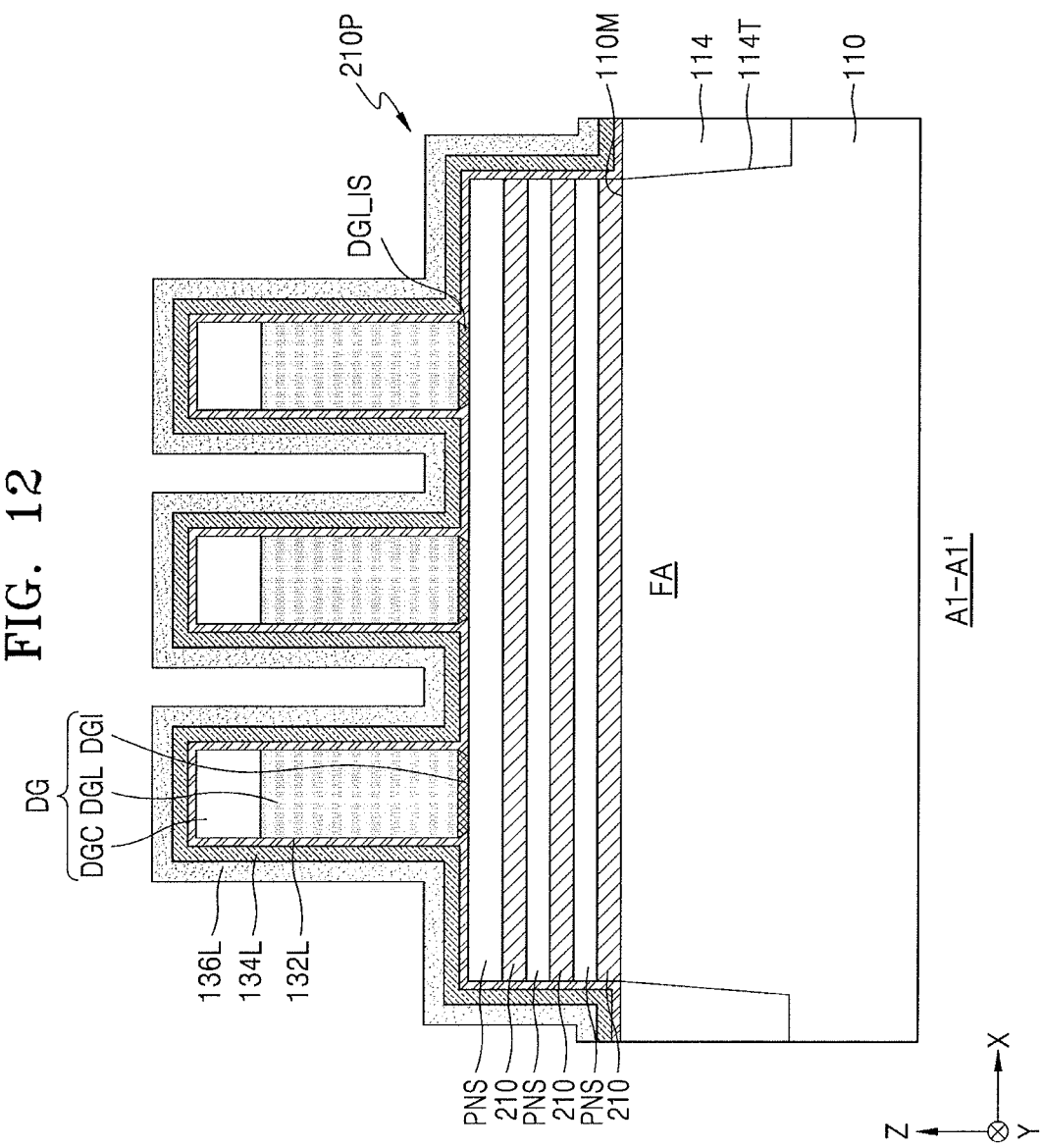

Referring to FIG. 12, the first spacer layer 132L, the second spacer layer 134L, and the cover spacer layer 136L may be sequentially formed on the dummy gate structure DG. For example, the first spacer layer 132L, the second spacer layer 134L may be formed of silicon nitride or silicon oxynitride, and the cover spacer layer 136L may be formed of silicon oxide. However, embodiments are not limited thereto.

The first spacer layer 132L may be conformally formed on the recessed sidewall DGI_OS of the dummy gate insulation layer DGI. Thus, a portion of the first spacer layer 132L contacting the recess sidewall DGI_IS of the dummy gate insulation layer DGI may correspond to the protrusion 132P of the first spacer 132 shown in FIG. 4.

Figure 13:
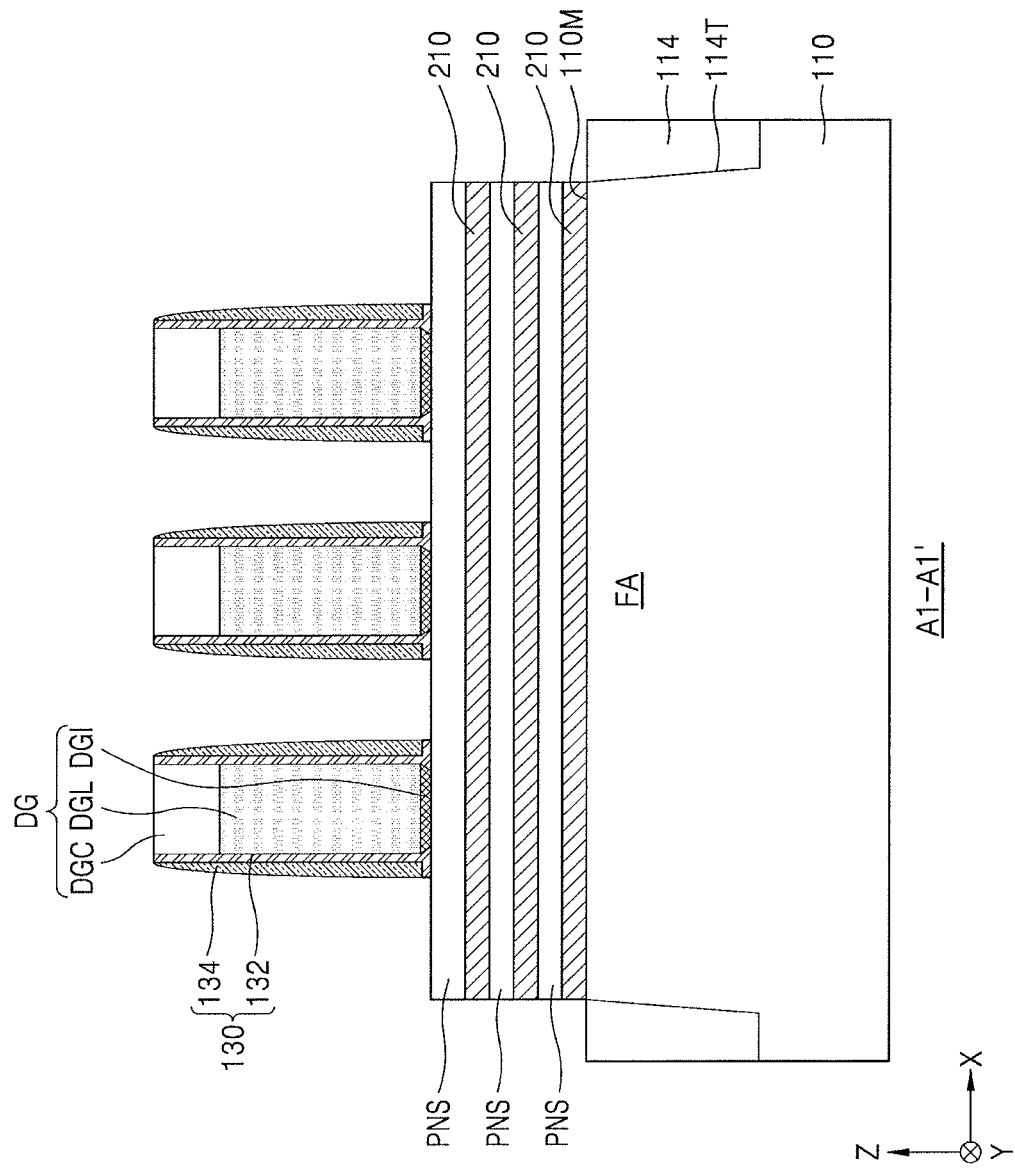

Referring to FIG. 13, an anisotropic etching process may be performed on the first spacer layer 132L, the second spacer layer 134L, and the cover spacer layer 136L to form the spacer structure 130 on each of opposite sidewalls of the dummy gate structure DG.

In the anisotropic etching process, the cover spacer layer 136L on an upper surface of the dummy gate structure DG and an upper surface of the sacrificial pattern 210P may also be removed. The spacer structure 130 may include the first spacer 132 and the second spacer 134 that are sequentially disposed on each of the sidewalls of the dummy gate structure DG. A bottom surface of the second spacer 134 may be covered by the first spacer 132. As shown in FIG. 13, the cover spacer layer 136L may be completely removed, and thus a sidewall of the second spacer 134 may not be covered by the cover spacer layer 136L. However, in some embodiments, a portion of the cover spacer layer 136L may remain on a portion of the sidewall of the second spacer 134. In this case, an additional etching process may be further performed to remove the cover spacer layer 136L. In some embodiments, the additional etching process for removing the cover spacer layer 136 may not be performed, and the remaining portion of the cover spacer layer 136L may be removed in a subsequent process for forming the recess region RS1.

Figure 14A:
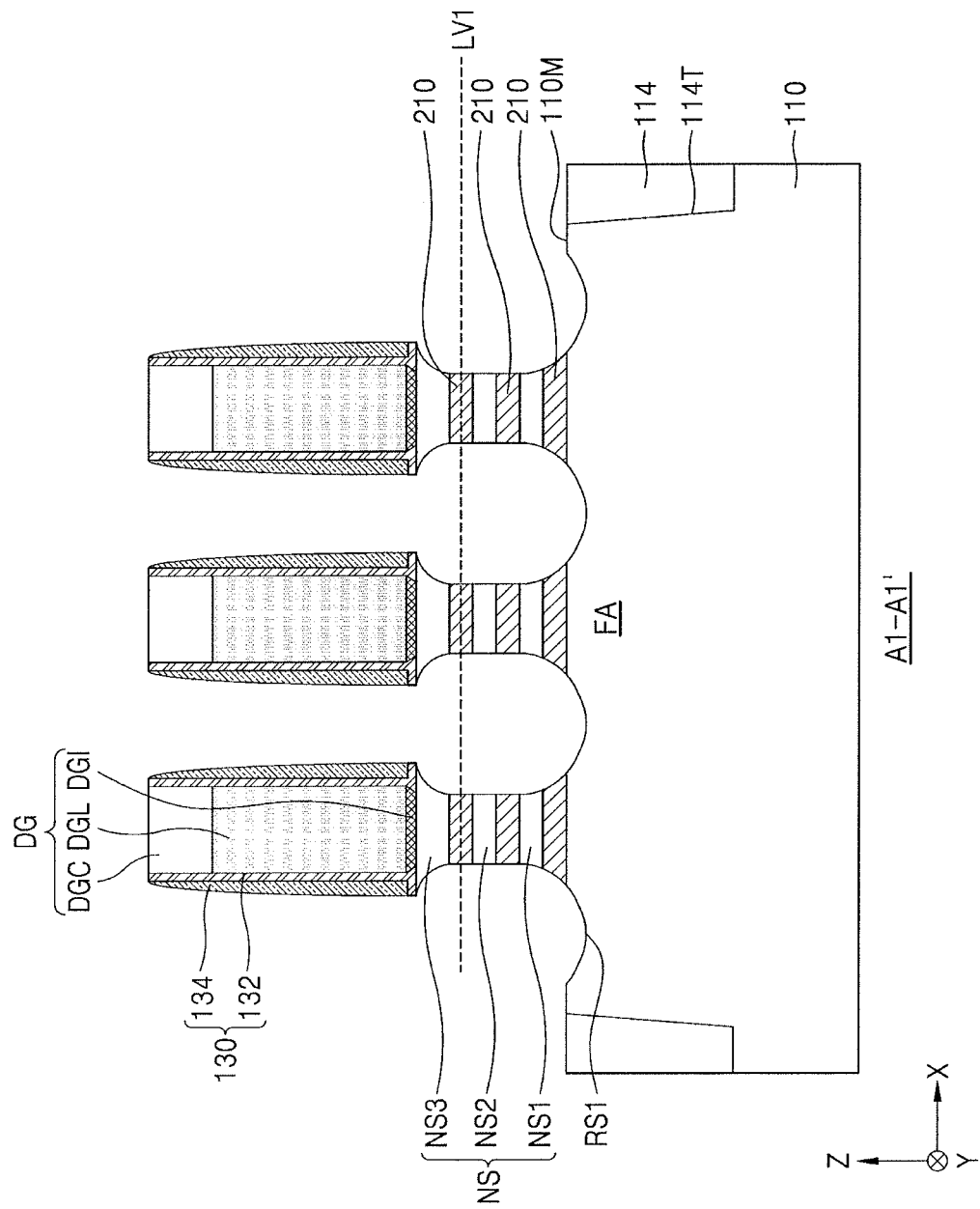
Figure 14B:
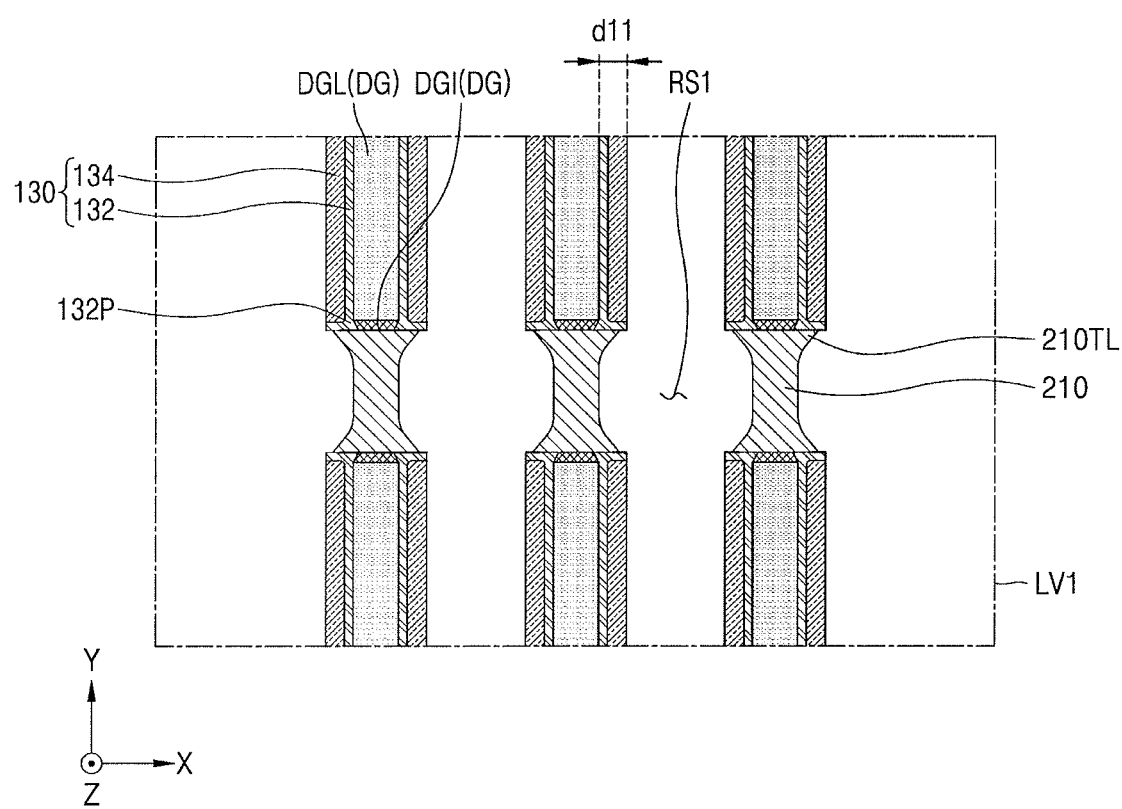

Referring to FIGS. 14A and 14B, portions of the sacrificial pattern 210P and the substrate 110 at opposite sides of the dummy gate structure DG and the spacer structure 130 may etched to form the recess region RS1 at each of the opposite sides of the dummy gate structure DG. As the recess region RS1 is formed, the sacrificial pattern 210P may be separated into a plurality of semiconductor patterns NS. For example, the plurality of semiconductor patterns NS may include the first, second, and third semiconductor patterns NS1, NS2, and NS3 spaced apart from each other by the sacrificial layers 210.

In some embodiments, in the process of forming the recess region RS1, the uppermost semiconductor pattern NS overlapped with the spacer structure 130 may not be removed (or a portion of the third semiconductor pattern NS3 may not be removed, but the other semiconductor pattern NS (e.g., the second semiconductor pattern NS2 or the first semiconductor pattern NS1) overlapped with the spacer structure 130 may be removed). A width of an intermediate portion of the recess region RS1 may greater than a width of an upper portion of the recess region RS1. The plurality of sacrificial layers 210 may include a tail portion 210TL overlapped with the spacer structure 130. The plurality of semiconductor patterns NS may include the tail portion (see e.g., NSTL of FIG. 4) overlapped with the spacer structure 130, similar to the tail portion 210TL of the plurality of sacrificial layers 210.

As described above, since, in the formation process of the spacer structure 130, the surface of the second spacer layer 134L is covered by the cover spacer layer 136L, the spacer structure 130 remaining after the anisotropic etching process may have a relatively great width d11 in the first direction X. For example, when the width d11 of the spacer structure 130 in the first direction X is relatively great, in the formation process of the recess region RS1, portions of the sacrificial layers 210 adjacent to the spacer structure 130 may be less exposed to the etching environment, and thus the tail portion 210TL of each of the sacrificial layers 210 may be formed. In addition, since the first spacer 132 includes the protrusion 132P, a spacing distance between the recess region RS1 and the dummy gate structure DG may be relatively increased.

Figure 15A:
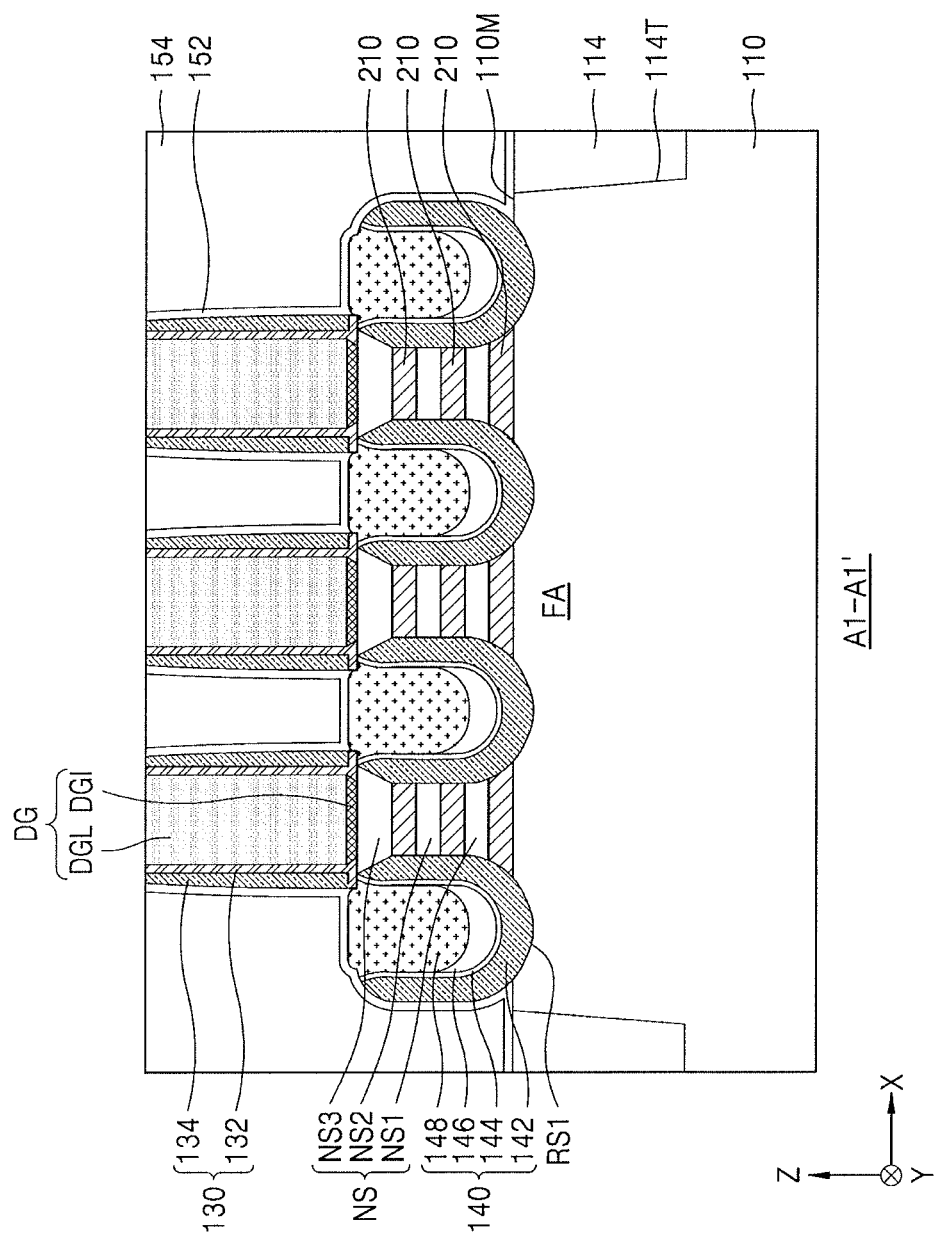
Figure 15B:
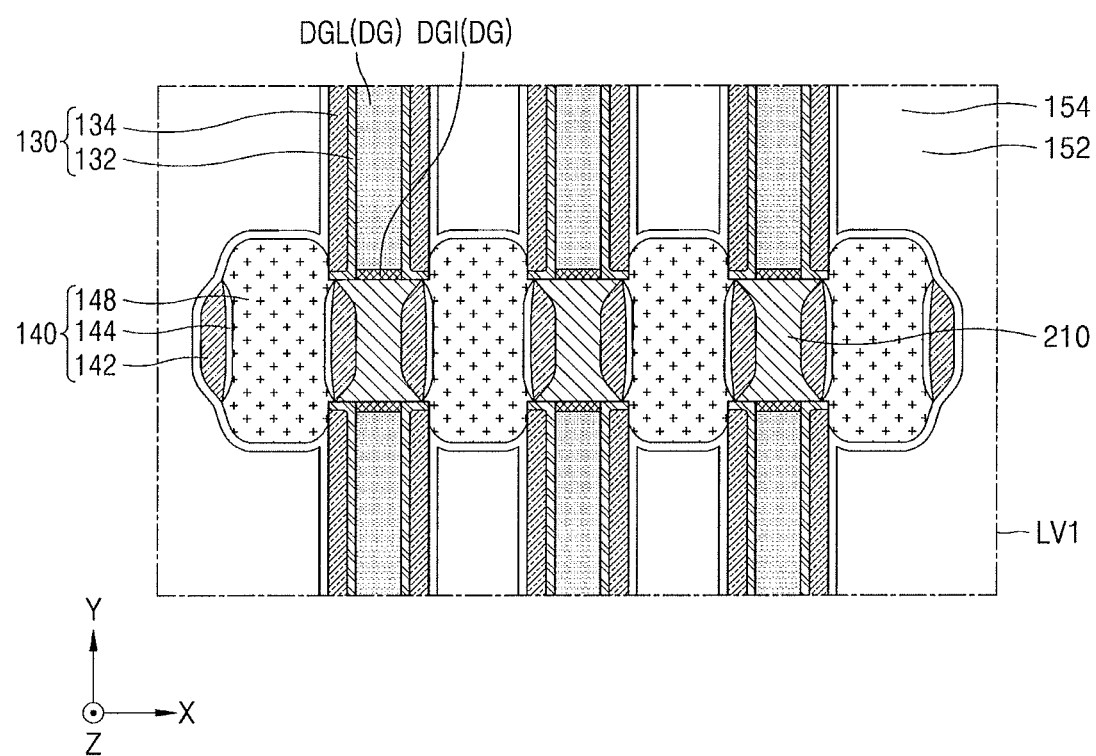

Referring to FIGS. 15A and 15B, the first semiconductor layer 142, the second semiconductor layer 144, the third semiconductor layer 146, and the fourth semiconductor layer 148 may be sequentially formed to form the source/drain region 140. For example, the first to fourth semiconductor layers 142, 144, 146, and 148 may be formed by epitaxially growing a semiconductor material from the plurality of semiconductor patterns NS, the sacrificial layers 210, and the substrate 110 exposed on an inner surface of the recess region RS1. The first to fourth semiconductor layers 142, 144, 146, and 148 may include at least one of a Si layer, a SiC layer, a SiGe layer, and a SiP layer that are epitaxially grown.

Thereafter, the gate insulation liner 152 and the inter-gate insulation layer 154 may be sequentially formed on the sidewall of the spacer structure 130, the source/drain region 140, and the device isolation layer 114. Upper portions of the dummy gate structure DG, the gate insulation liner 152, and the inter-gate insulation layer 154 may be planarized to remove the dummy gate capping layer DGC of the dummy gate structure DG, such that an upper surface of the dummy gate line DGL may be exposed.

Figure 16A:
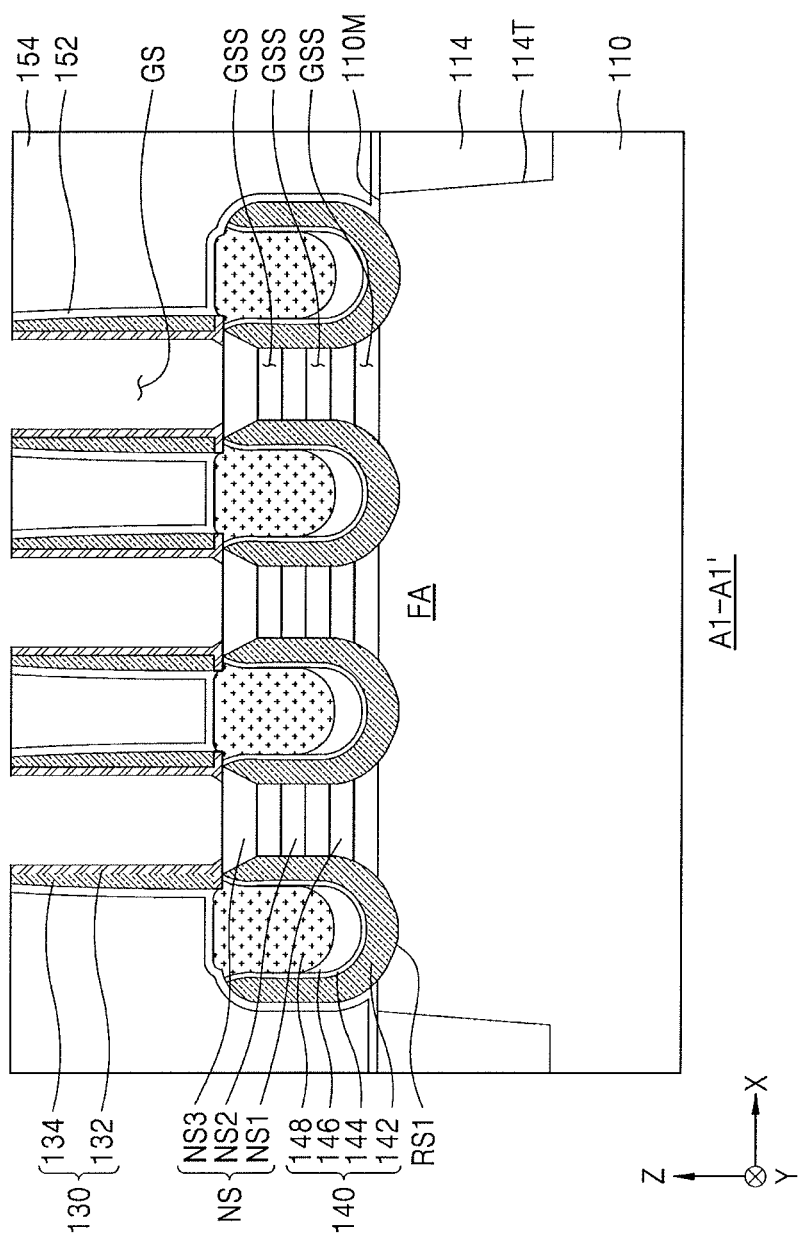
Figure 16B:
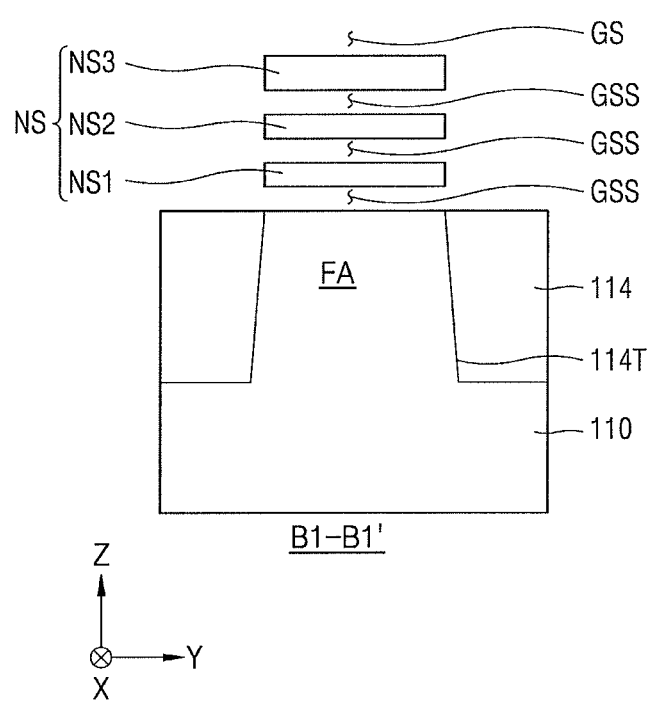

Referring to FIGS. 16A and 16B, the dummy gate line DGL and the dummy gate insulation layer DGI exposed by the inter-gate insulation layer 154 may be removed to form a gate space GS.

Thereafter, the plurality of sacrificial layers 210 remaining on the fin active region FA may be removed through the gate space GS to expose the plurality of semiconductor patterns NS and a portion of an upper surface of the fin active region FA. Accordingly, a sub gate space GSS may be formed between each of the plurality of semiconductor patterns NS and between a lowermost one of the plurality of semiconductor patterns NS and the fin active region FA. The removal process of the plurality of sacrificial layers 210 may be performed by a wet etching process using a difference in an etch selectivity between the plurality of sacrificial layers 210 and the plurality of semiconductor patterns NS.

As described above, since the width d11 of the spacer structure 130 in the first direction X is relatively great and the first spacer 132 includes the protrusion 132P, in the removal process of the dummy gate line DGL, the upper surface of the source/drain region 140 may not be exposed. For example, when a spacing distance between the source/drain region 140 and the dummy gate line DGL is relatively small, in the removal process of the dummy gate line DGL, an edge portion of the source/drain region 140 may also be exposed to the etching environment. Thus, a process failure in which the source/drain region 140 may be etched or a gate electrode material may be filled in the removed region of the source/drain region 140 may be generated. However, since the width d11 of the spacer structure 130 in the first direction X is relatively great and the first spacer 132 includes the protrusion 132P, the process defect may not be generated in the removal process of the dummy gate line DGL.

Figure 17A:
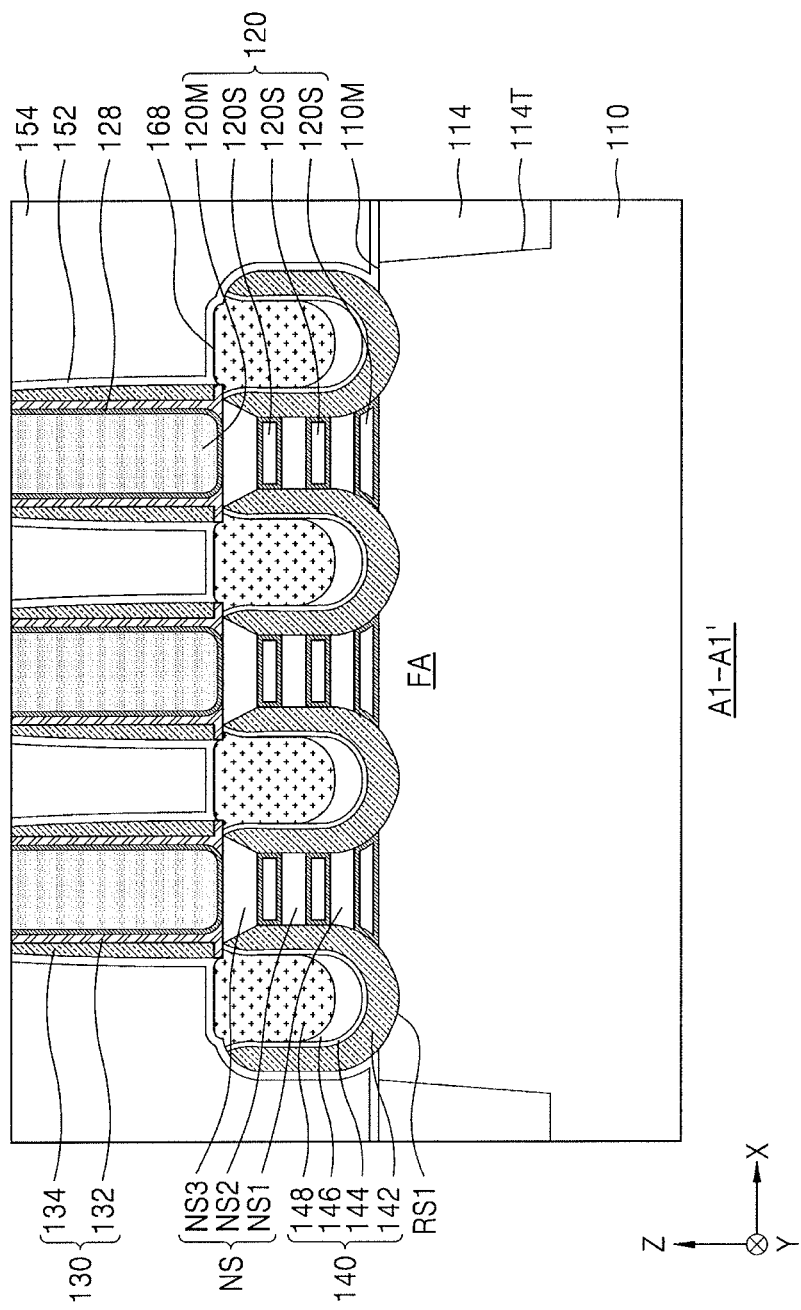
Figure 17B:
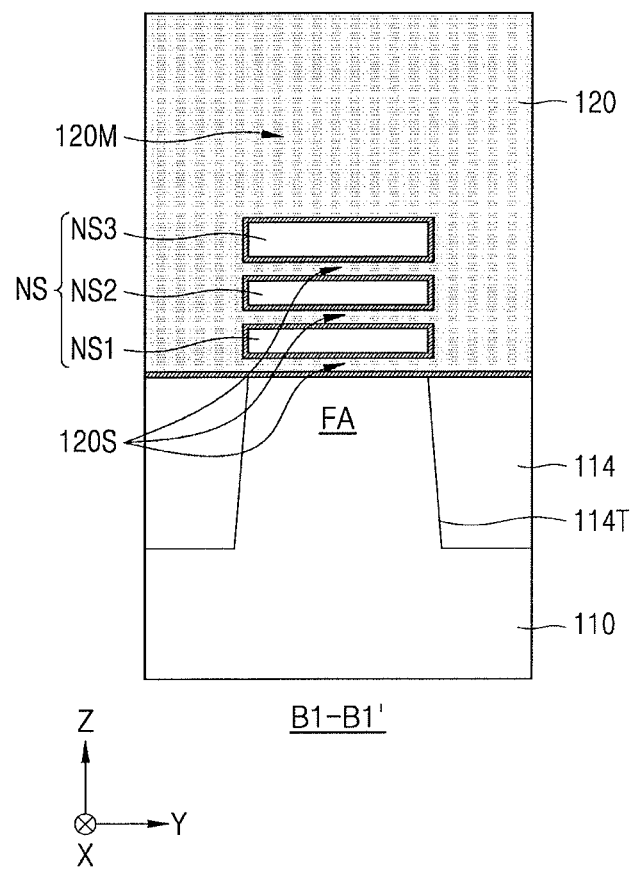

Referring to FIGS. 17A and 17B, the gate insulation layer 128 may be formed on inner surfaces of the gate space GS and the sub gate space GSS. The gate electrode 120 may be formed on the gate insulation layer 128 to fill the gate space GS and the sub gate space GSS. For example, after a work function conductive layer is conformally formed on the inner surfaces of the gate space GS and the sub gate space GSS, a buried conductive layer may be formed on the work function conductive layer to fill the gate space GS and the sub gate space GSS. Thereafter, an upper portion of the buried conductive layer may be planarized until an upper surface of the inter-gate insulation layer 154 is exposed, such that the gate electrode 120 may be formed. In some embodiments, the work function conductive layer may be formed of Al, Cu, Ti, Ta, W, Mo, TaN, NiSi, CoSi, TiN, WN, TiAl, TiAlC, TiAlN, TaCN, TaC, TaSiN, or a combination thereof. The buried conductive layer may be formed of Al, Cu, Ti, Ta, W, Mo, TaN, NiSi, CoSi, TiN, WN, TiAl, TiAlC, TiAlN, TaCN, TaC, TaSiN, or a combination thereof.

Referring again to FIG. 2, after the upper insulation layer 162 is formed and then a contact hole 166H penetrating the upper insulation layer 162 is formed, the contact hole 166H may be filled with a conductive material to form the contact plug 166.

According to the aforementioned method of manufacturing the integrated circuit 100, as the second spacer layer 134L is covered by the cover spacer layer 136L in the formation process of the spacer structure 130, the width d11 of the spacer structure 130 in the first direction X may be relatively great. In addition, as the etching process for forming the recess sidewall DGI_IS of the dummy gate insulation layer DGI is performed, the first spacer 132 may include the protrusion 132P. Thus, since the spacing distance between the source/drain region 140 and the dummy gate structure DG is relatively increased, the upper surface of the source/drain region 140 may not exposed by the gate space GS. The exposure and removal of the source/drain region 140 may not occur in the aforementioned removal process of the dummy gate line DGL.

Figure 18:
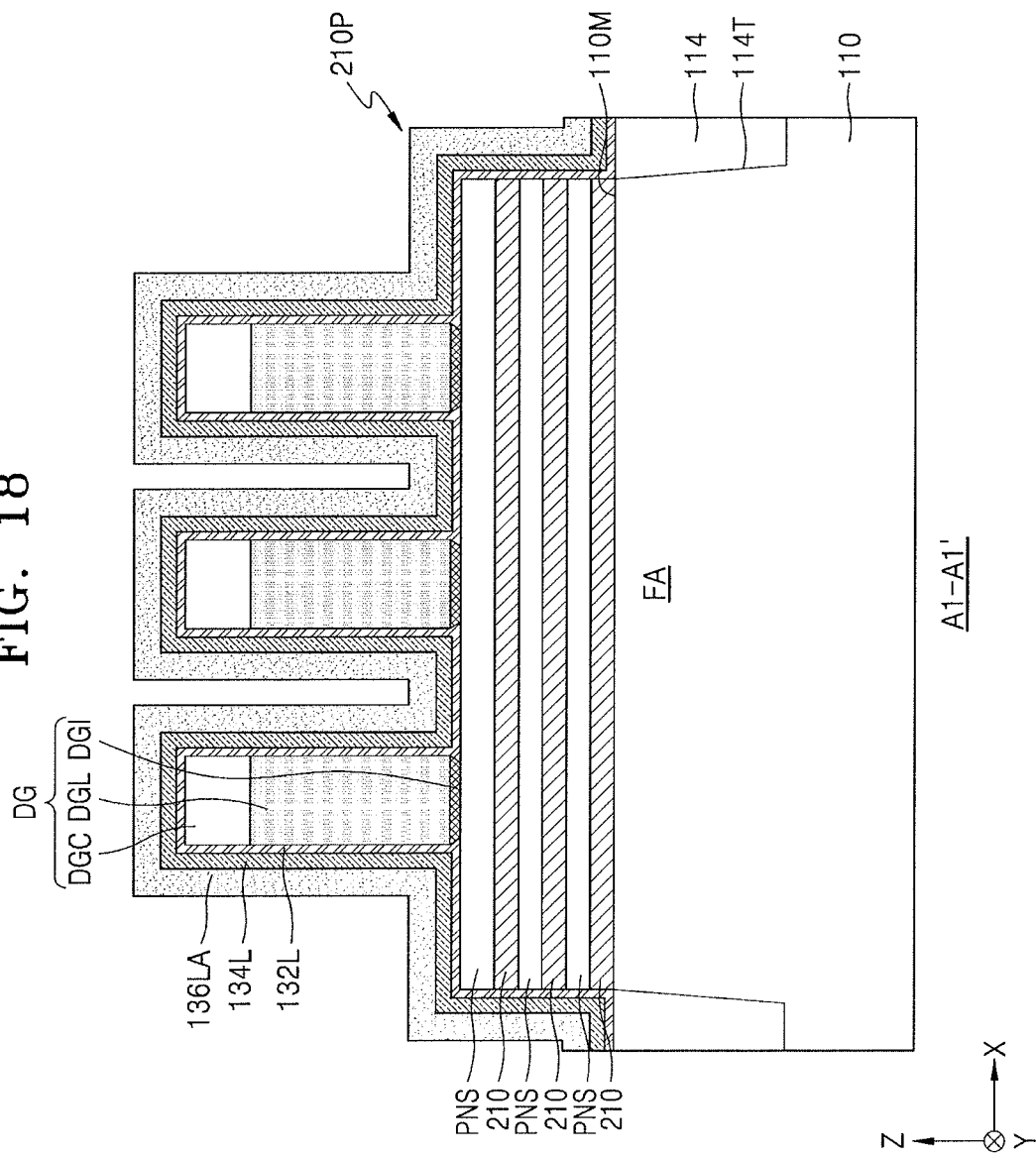
FIGS. 18, 19A, and 19B are cross-sectional views illustrating a method of manufacturing an integrated circuit according to example embodiments.
Figure 19A:
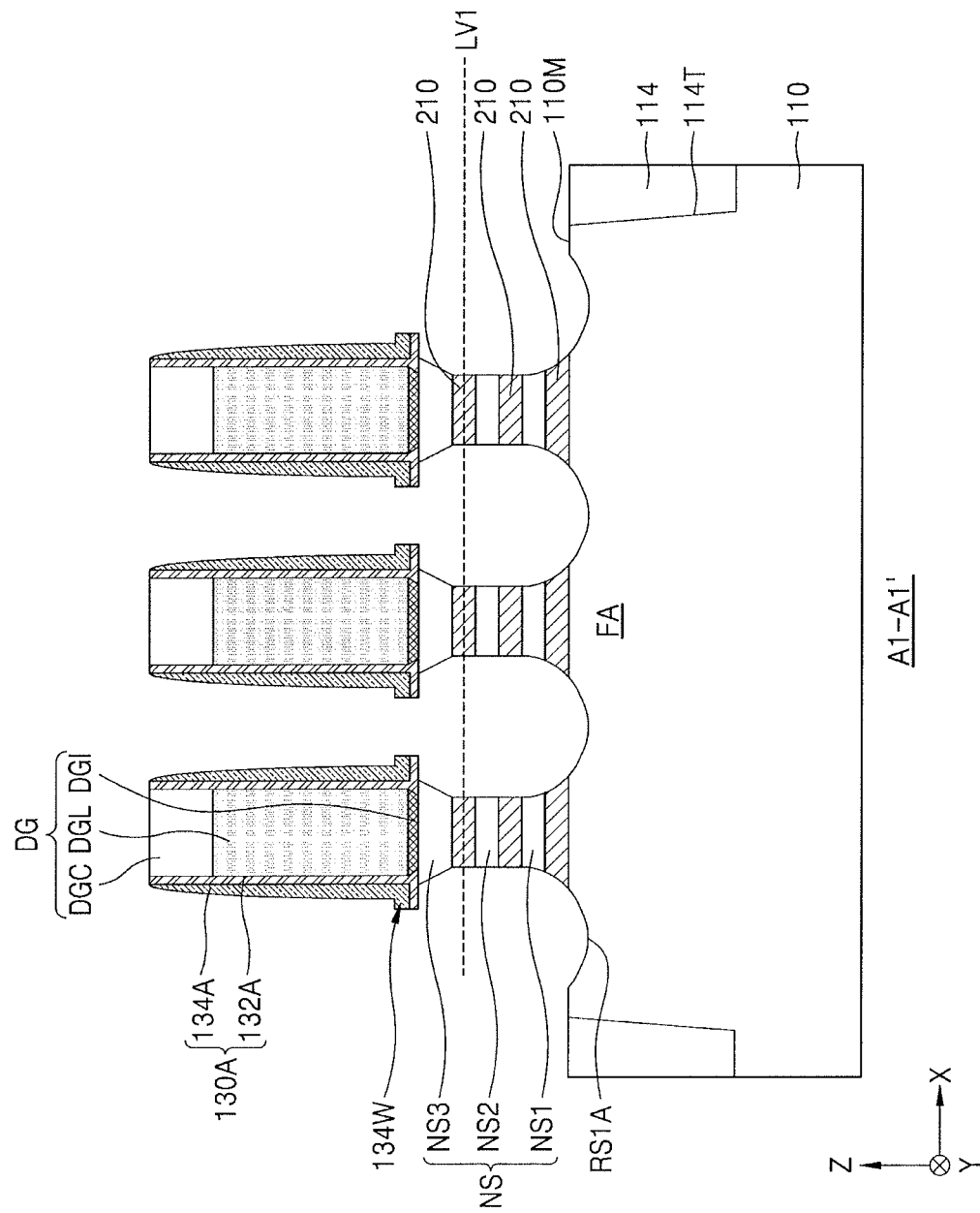
Figure 19B:
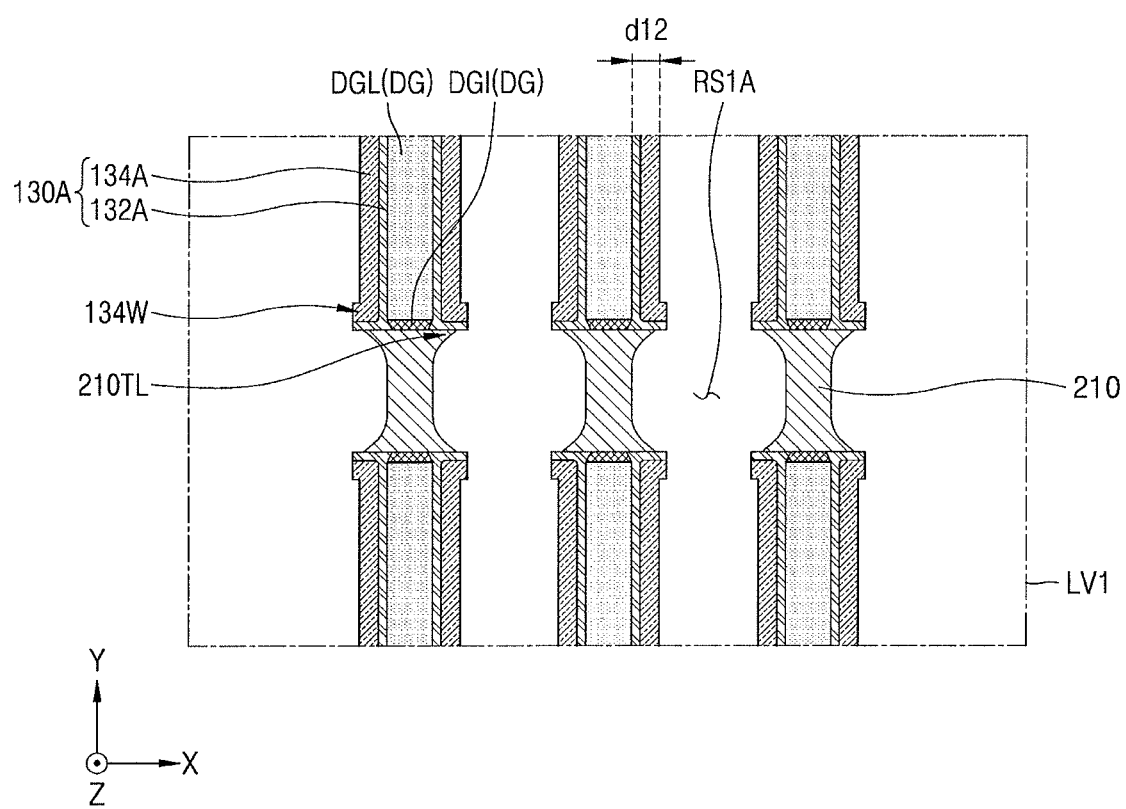

FIGS. 18, 19A, and 19B are cross-sectional views illustrating a method of manufacturing an integrated circuit according to example embodiments. FIGS. 18 and 19A are cross-sectional views taken along line A1-A1' of FIG. 1. FIG. 19B is a horizontal sectional view at a first vertical level LV1 of FIG. 19A.

Referring to FIG. 18, the first spacer layer 132L, the second spacer layer 134L, and a cover spacer layer 136LA may be sequentially formed on an upper surface and sidewalls of the dummy gate structure DG. The cover spacer layer 136LA may have a thickness that is relatively great.

Referring to FIGS. 19A and 19B, an anisotropic etching process may be performed on the first spacer layer 132L, the second spacer layer 134L, and the cover spacer layer 136LA to form a spacer structure 130A. In the anisotropic etching process, the second spacer 134A may be formed to include the lateral extension 134W extending in the horizontal direction.

As shown in FIG. 19A, the cover spacer layer 136LA may be completely removed, such that the sidewall of the second spacer 134A may not be covered. However, in some embodiments, a portion of the cover spacer layer 136LA may remain on at least a portion of the sidewall of the second spacer 134A. In this case, an additional etching process may be performed to remove the cover spacer layer 136LA. In some embodiments, the additional etching process for removing the cover spacer layer 136LA may not be performed, and the remaining portion of the cover spacer layer 136LA may also be removed in a subsequent process for forming a recess region RS1A.

Thereafter, portions of the sacrificial pattern 210P and the substrate 110 at opposite sides of the dummy gate structure DG and the spacer structure 130A may be etched to form the recess region RS1A at each of the opposite sides of the dummy gate structure DG.

As described above, in the formation process of the spacer structure 130A, as the second spacer layer 134L is covered by the relatively thick cover spacer layer 136LA, the spacer structure 130A remaining in the anisotropic etching process may have a relatively great width d12 in the first direction X. For example, when the width d12 of the spacer structure 130A in the first direction X is relatively great, in the formation process of the recess region RS1A, portions of the sacrificial layers 210 adjacent to the spacer structure 130A may not be less exposed to the etching environment. Thus, the tail portion 210TL of each of the sacrificial layers 210 may be formed.

Thereafter, the processes described with reference to FIGS. 15A to 17B may be performed to form an integrated circuit 100A.

Figure 20:
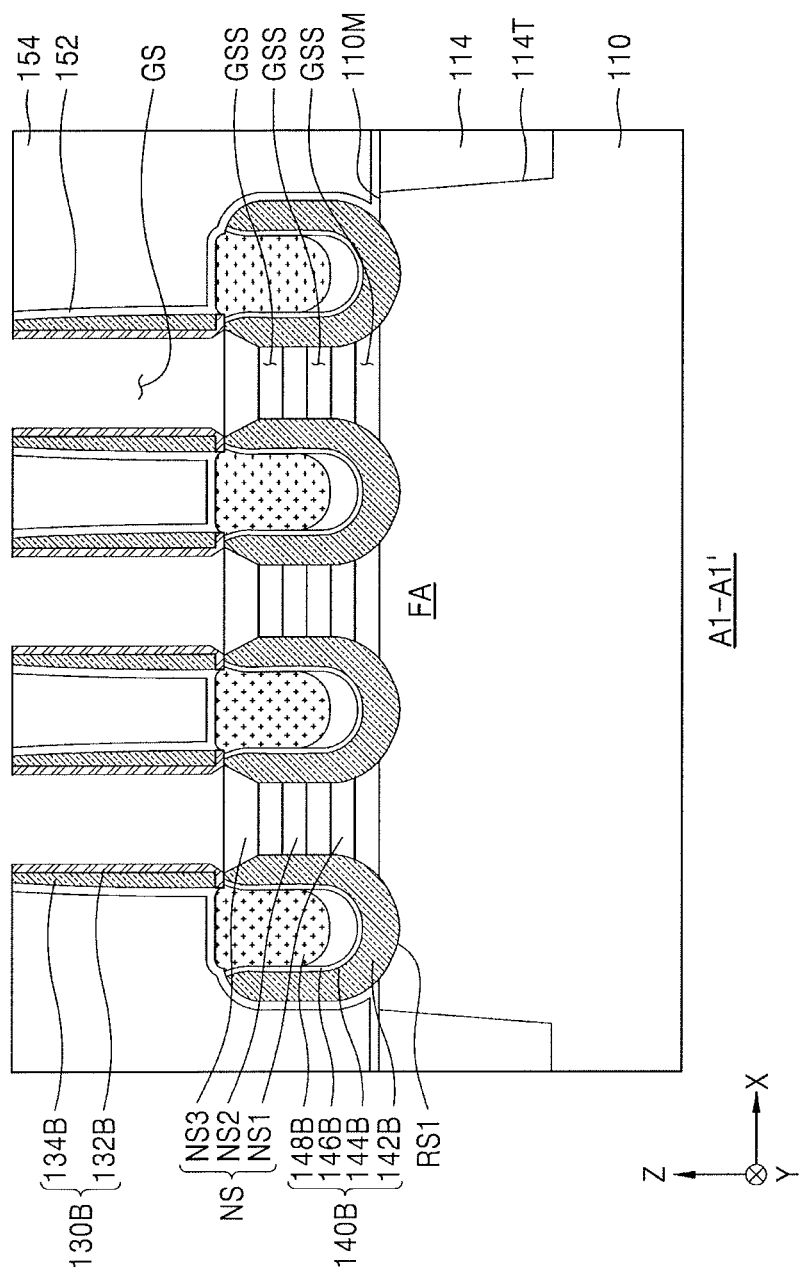
FIGS. 20 and 21 are cross-sectional views illustrating a method of manufacturing an integrated circuit according to example embodiments.
Figure 21:
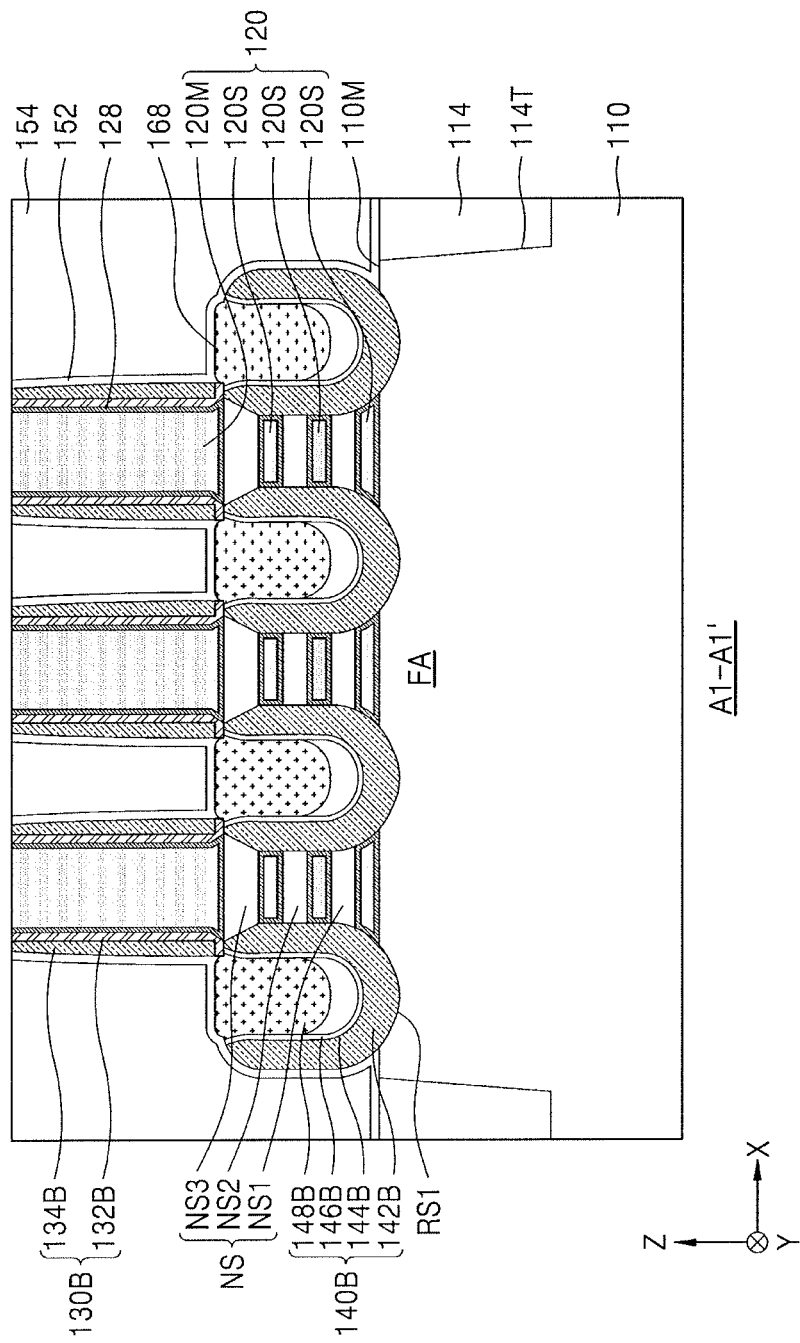

FIGS. 20 and 21 are cross-sectional views illustrating a method of manufacturing an integrated circuit according to example embodiments.

First, the process described with reference to FIGS. 16A and 16B, may be performed. That is, the dummy gate line DGL and the dummy gate insulation layer DGI that are exposed by the inter-gate insulation layer 154 may be removed to form the gate space GS, and the sacrificial layers 210 exposed through the gate space GS may be removed to form the sub gate space GSS between each of the plurality of semiconductor patterns NS and between the lowermost semiconductor pattern NS and the fin active region FS. At that time, the first spacer 132 may include the protrusion 132P at the bottom portion thereof, and thus, in the removal process of the dummy gate line DGL, a relatively great spacing distance may be secured between the source/drain region 140 and the gate space GS.

Referring to FIG. 20, a portion of a bottom portion of the first spacer 132 exposed in the gate space GS may be removed. Thus, a width of a bottom portion of the gate space GS may be greater than a width of an intermediate portion of the gate space GS.

Referring to FIG. 21, the gate insulation layer 128 and the gate electrode 120 may be formed on inner surfaces of the gate space GS and the sub gate space GSS. The main gate part 120MB may be formed to include the protrusion (see 120MP of FIG. 6) filling an edge of the bottom portion of the gate space GS.

According to the aforementioned method, in the removal process of the dummy gate structure DG, since the relatively great spacing distance is obtained between the dummy gate structure DG and the source/drain region 140, the source/drain region 140 may not be exposed to an etch environment in the removal process of the dummy gate structure DG.

Figure 22:
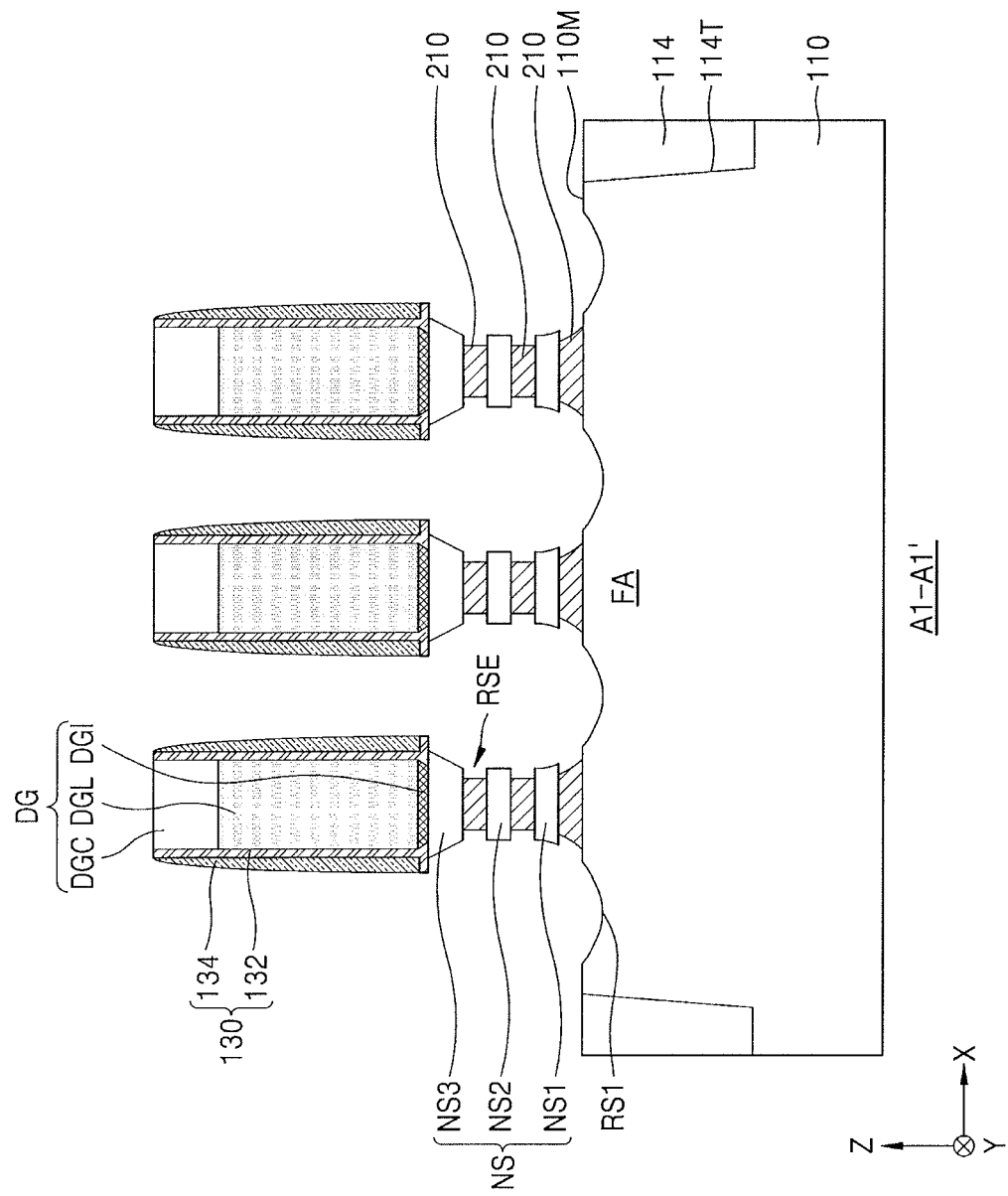
FIGS. 22, 23, and 24 are cross-sectional views illustrating a method of manufacturing an integrated circuit according to example embodiments.
Figure 23:
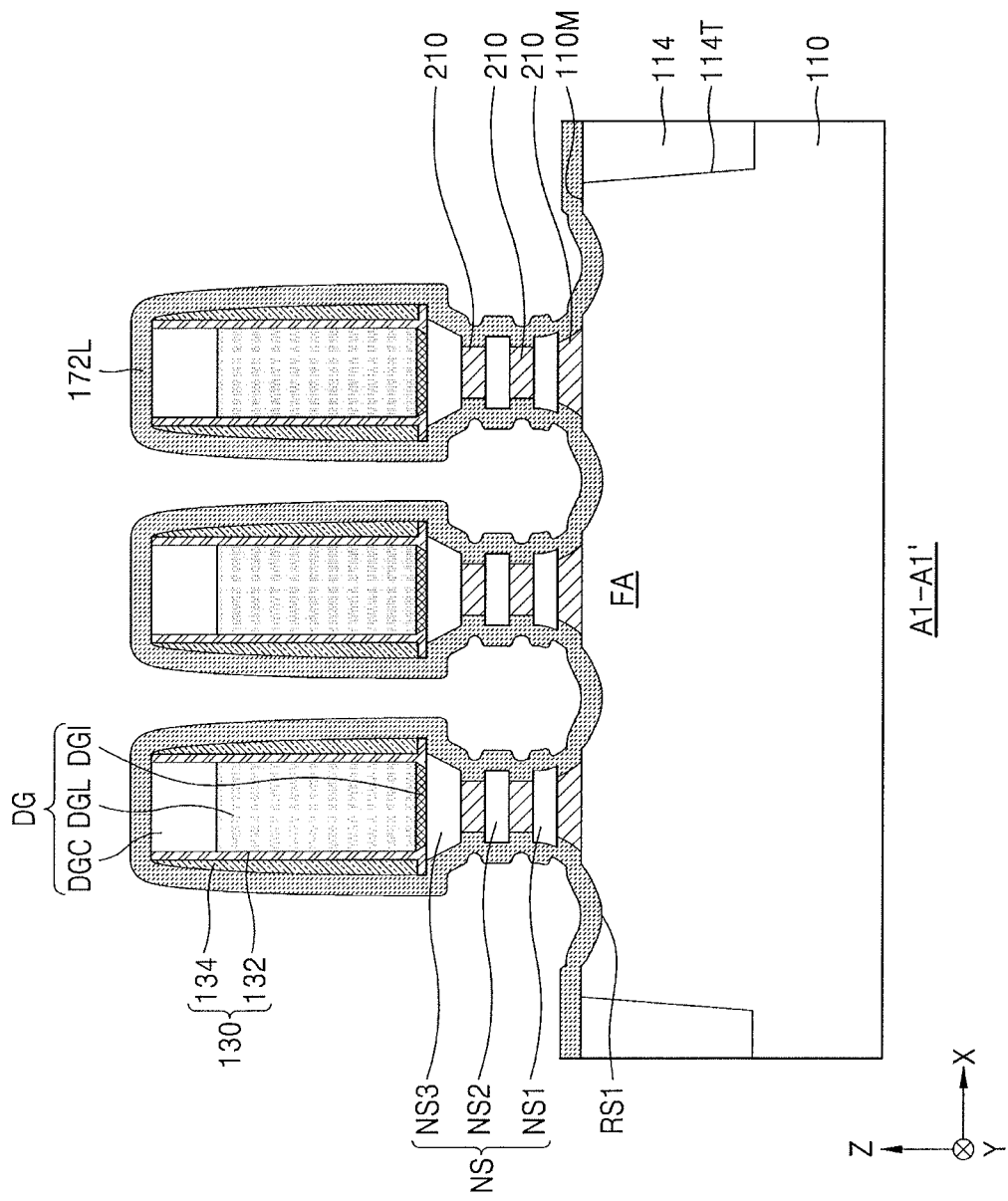
Figure 24:
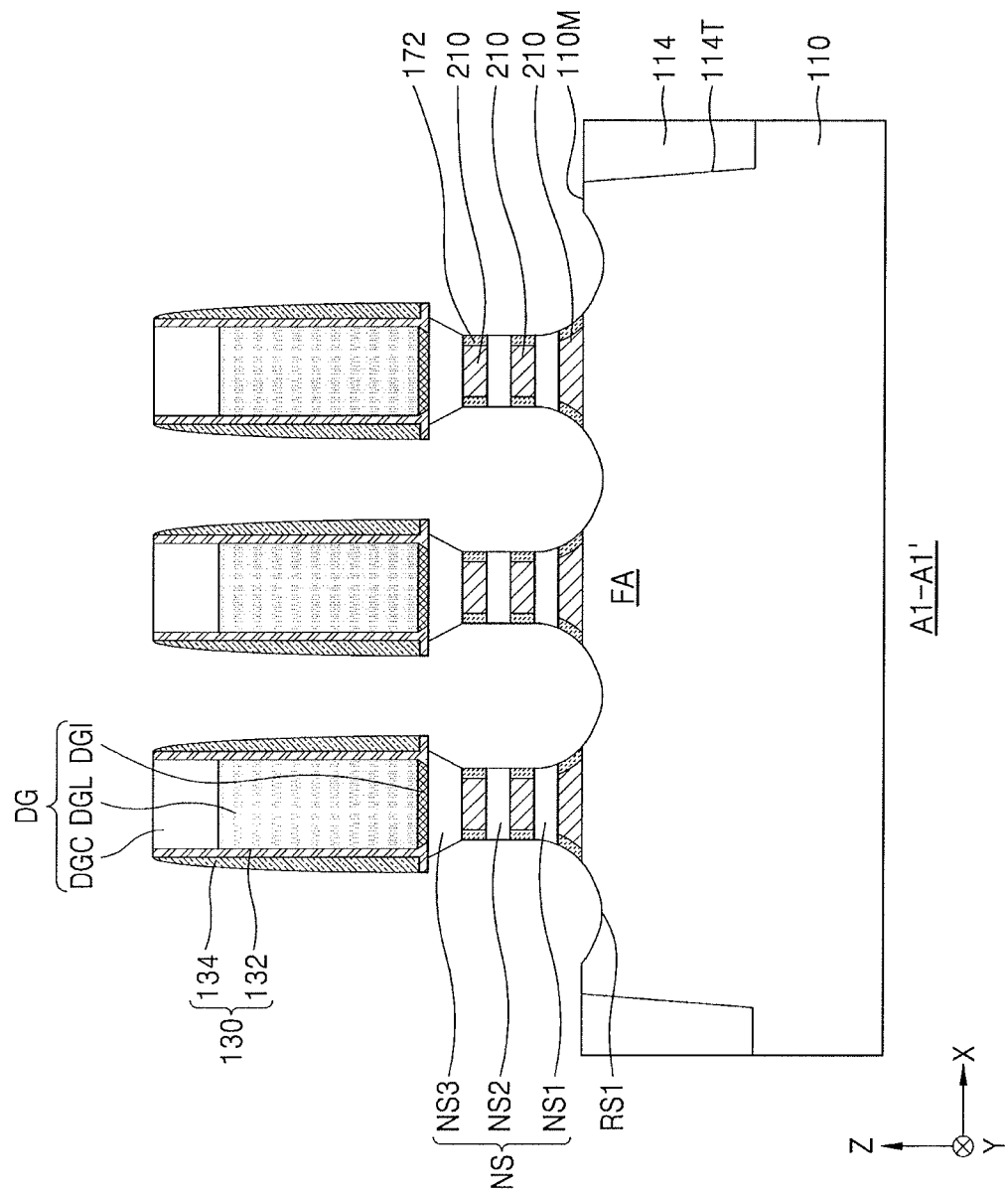

FIGS. 22, 23, and 24 are cross-sectional views illustrating a method of manufacturing an integrated circuit according to example embodiments.

Referring to FIG. 22, in the structure in which the recess region RS1 is formed, portions of the sacrificial layers 210 exposed in the recess region RS1 may be removed by an isotropic etching process to form an indent region RSE between each of the plurality of semiconductor patterns NS. In some embodiments, a wet etching process using a difference in the etch selectivity between the plurality of sacrificial layers 210 and the plurality of semiconductor patterns NS may be performed to form the indent region RSE. For example, in the wet etching process, the sacrificial layers 210 including SiGe may be more rapidly etched than the plurality of semiconductor patterns NS including Si, thus forming the indent region RSE.

Referring to FIG. 23, an inner spacer layer 172L may be conformally formed on an upper surface of the dummy gate structure DG, a sidewall of the spacer structure 130, an inner surface of the recess region RS1, and an inner surface of the indent region RSE. The inner spacer layer 172L may be formed to a sufficient thickness to fill the indent region RSE.

Referring to FIG. 24, an anisotropic etching process may be performed on the inner spacer layer 172L, such that an inner spacer 172 may remain in the indent region RSE. In the anisotropic etching process, the inner spacer layer 172L on the dummy gate structure DG and the sidewall of the spacer structure 130, and in the recess region RS1 may be removed.

Thereafter, the process described with reference to FIGS. 15A to 17B may be performed to form an integrated circuit 100C.

While example embodiments have been shown and described, it will be understood by those of ordinary skill in the art that various changes in form and details may be made thereto without departing from the spirit and scope of the present invention as set forth by the following claims.

What is claimed is:

1. A method of manufacturing an integrated circuit, the method comprising:
   alternately forming a plurality of semiconductor layers and a plurality of sacrificial layers on a substrate;
   patterning the plurality of semiconductor layers and the plurality of sacrificial layers to form a channel stack extending in a first direction;
   forming a dummy gate structure on the channel stack, the dummy gate structure including a dummy gate insulating layer pattern and a dummy gate;
   forming a spacer structure on a sidewall of the dummy gate structure, the spacer structure including a first spacer layer and a second spacer layer, the first spacer layer including a portion overhanging laterally and outwardly;
   forming a plurality of semiconductor patterns and forming a recess region by removing a portion of the channel stack, the portion of the channel stack being not covered by the spacer structure, and an uppermost one of the plurality of semiconductor patterns having an inverted trapezoidal cross-section and an inclined sidewall;
   forming a semiconductor layer in the recess region;
   forming a gate space by removing the dummy gate structure and the plurality of sacrificial layers, the gate space including sub gate spaces between the plurality of semiconductor patterns; and
   forming a gate electrode in the gate space.

2. The method as claimed in claim 1, wherein forming the semiconductor layer includes forming the semiconductor layer in the recess region such that a portion of a top surface of the semiconductor layer is in contact with a bottom surface of the spacer structure.

3. The method as claimed in claim 1, wherein, during forming of the semiconductor layer, the inclined sidewall of the uppermost one of the plurality of semiconductor patterns is in contact with the semiconductor layer.

4. The method as claimed in claim 1, wherein the uppermost one of the plurality of semiconductor patterns includes a tail portion under the spacer structure.

5. The method as claimed in claim 1, wherein, during forming of the gate space, a center portion of a top surface of the uppermost one of the plurality of semiconductor patterns is exposed, not being covered by the spacer structure, while an edge portion of an upper surface of the uppermost one of the plurality of semiconductor patterns is covered by the spacer structure.

6. The method as claimed in claim 1, wherein a top surface of the uppermost one of the plurality of semiconductor patterns has a first width in the first direction, and a bottom surface of the uppermost one of the plurality of semiconductor patterns has a second width smaller than the first width in the first direction.

7. The method as claimed in claim 6, wherein the gate electrode includes:
   a main gate part disposed on the uppermost one of the plurality of semiconductor patterns; and
   a plurality of sub gate parts disposed between two corresponding patterns among the plurality of semiconductor patterns,
   wherein a bottom surface of the main gate part has a third width in the first direction, and an intermediate portion of the main gate part has a fourth width different from the third width in the first direction.

8. The method as claimed in claim 7, wherein the third width is smaller than the first width.

9. The method as claimed in claim 7, wherein:
   the main gate part includes a bottom portion having a sloped sidewall,
   the sloped sidewall of the main gate part is vertically overlapped with at least a portion of the spacer structure, and
   at least a portion of a bottom surface of the spacer structure is under the sloped sidewall of the main gate part.

10. A method of manufacturing an integrated circuit, the method comprising:
    alternately forming a plurality of semiconductor layers and a plurality of sacrificial layers on a substrate;
    patterning the plurality of semiconductor layers and the plurality of sacrificial layers to form a channel stack extending in a first direction;
    forming a dummy gate structure on the channel stack, the dummy gate structure including a dummy gate insulating layer pattern and a dummy gate;
    forming a spacer structure on a sidewall of the dummy gate structure, the spacer structure including a first spacer layer and a second spacer layer, the first spacer layer including a portion overhanging laterally and outwardly;
    forming a plurality of semiconductor patterns and forming a recess region by removing a portion of the channel stack, the portion of the channel stack being not covered by the spacer structure, and an uppermost one of the plurality of semiconductor patterns including an inclined sidewall;
    forming a semiconductor layer in the recess region, a portion of the semiconductor layer contacting the inclined sidewall, and the portion of the semiconductor layer vertically overlapping the spacer structure;
    forming a gate space by removing the dummy gate structure and the plurality of sacrificial layers; and
    forming a gate electrode in the gate space,
    wherein a top surface of the uppermost one of the plurality of semiconductor patterns has a first width in the first direction, and a bottom surface of the uppermost one of the plurality of semiconductor patterns has a second width smaller than the first width in the first direction.

11. The method as claimed in claim 10, wherein, during forming of the gate space, a center portion of a top surface of the uppermost one of the plurality of semiconductor patterns is exposed, not being covered by the spacer structure, while an edge portion of an upper surface of the uppermost one of the plurality of semiconductor patterns is covered by the spacer structure.

12. The method as claimed in claim 10, wherein the gate electrode includes:
    a main gate part disposed on the uppermost one of the plurality of semiconductor patterns; and
    a plurality of sub gate parts disposed between two corresponding patterns among the plurality of semiconductor patterns, wherein a bottom surface of the main gate part has a third width in the first direction, and an intermediate portion of the main gate part has a fourth width different from the third width in the first direction.

13. The method as claimed in claim 12, wherein the third width is smaller than the first width.

14. The method as claimed in claim 12, wherein:
the main gate part includes a bottom portion having a sloped sidewall,
the spacer structure includes a sidewall portion in contact with the sloped sidewall of the main gate part, and
at least a portion of a bottom surface of the spacer structure is under the sloped sidewall of the main gate part.

15. The method as claimed in claim 14, wherein forming the dummy gate structure includes:
forming a dummy gate insulating layer on an upper surface of the channel stack;
forming a dummy gate layer on the dummy gate insulating layer;
patterning the dummy gate insulating layer and the dummy gate layer to form the dummy gate insulating layer pattern and the dummy gate, such that a portion of the dummy gate insulating layer pattern protrudes outwardly with respect to a sidewall of the dummy gate; and
removing the portion of the dummy gate insulating layer pattern, such that the dummy gate insulating layer pattern is recessed inwardly with respect to the sidewall of the dummy gate.

16. The method as claimed in claim 15, wherein:
during forming of the spacer structure, the sidewall portion of the spacer structure is in contact with the dummy gate insulating layer, and
during forming of the gate electrode, the sloped sidewall of the main gate part is in contact with the sidewall portion of the spacer structure.

17. A method of manufacturing an integrated circuit, the method comprising:
alternately forming a plurality of semiconductor layers and a plurality of sacrificial layers on a substrate;
patterning the plurality of semiconductor layers and the plurality of sacrificial layers to form a channel stack extending in a first direction;
forming a dummy gate structure on the channel stack, the dummy gate structure including a dummy gate insulating layer pattern and a dummy gate;
forming a spacer structure on a sidewall of the dummy gate structure, the spacer structure including a first spacer layer and a second spacer layer, the first spacer layer including a portion overhanging laterally and outwardly, and the second spacer layer including a lateral extension extending outwardly;
forming a plurality of semiconductor patterns and forming a recess region by removing a portion of the channel stack, the portion of the channel stack being not covered by the spacer structure;
forming a semiconductor layer in the recess region, a portion of the semiconductor layer being covered by the lateral extension;
forming a gate space by removing the dummy gate structure and the plurality of sacrificial layers; and
forming a gate electrode in the gate space,
wherein a top surface of an uppermost one of the plurality of semiconductor patterns has a first width in the first direction, and a bottom surface of the uppermost one of the plurality of semiconductor patterns has a second width smaller than the first width in the first direction.

18. The method as claimed in claim 17, wherein, during forming of the gate space, a center portion of a top surface of the uppermost one of the plurality of semiconductor patterns is exposed, not being covered by the lateral extension, while an edge portion of an upper surface of the uppermost one of the plurality of semiconductor patterns is covered by the lateral extension.

19. The method as claimed in claim 17, wherein the gate electrode includes:
a main gate part disposed on the uppermost one of the plurality of semiconductor patterns; and
a plurality of sub gate parts disposed between two corresponding patterns among the plurality of semiconductor patterns,
wherein a bottom surface of the main gate part has a third width in the first direction, and an intermediate portion of the main gate part has a fourth width different from the third width in the first direction, and
wherein the third width is smaller than the first width.

20. The method as claimed in claim 17, wherein forming the spacer structure includes:
forming the first spacer layer and the second spacer layer conformally on the sidewall and a top surface of the dummy gate structure and on the channel stack;
forming a cover spacer layer on the second spacer layer;
leaving the spacer structure on the sidewall of the dummy gate structure by performing anisotropic etching process, the lateral extension of the second spacer layer being under the cover spacer layer; and
removing the cover spacer layer.

* * * * *